(12) United States Patent
Maeda

(10) Patent No.: US 8,159,059 B2
(45) Date of Patent: Apr. 17, 2012

(54) MICROELECTROMECHANICAL DEVICE AND METHOD FOR MANUFACTURING THE SAME

(75) Inventor: Toshihiko Maeda, Kirishima (JP)

(73) Assignee: Kyocera Corporation, Kyoto (JP)

( * ) Notice: Subject to any disclaimer, the term of this patent is extended or adjusted under 35 U.S.C. 154(b) by 401 days.

(21) Appl. No.: 12/438,936

(22) PCT Filed: Jan. 29, 2007

(86) PCT No.: PCT/JP2007/051422
§ 371 (c)(1),
(2), (4) Date: Feb. 25, 2009

(87) PCT Pub. No.: WO2008/023465
PCT Pub. Date: Feb. 28, 2008

(65) Prior Publication Data
US 2009/0261691 A1 Oct. 22, 2009

(30) Foreign Application Priority Data
Aug. 25, 2006 (JP) .................. 2006-229866

(51) Int. Cl.
*H01L 23/02* (2006.01)

(52) U.S. Cl. ................. 257/686; 257/E23.193

(58) Field of Classification Search ............ 257/704, 257/680, 415, 418, 693, 698, 396, 686, 787, 257/737, 774, E23.193
See application file for complete search history.

(56) References Cited

U.S. PATENT DOCUMENTS

| 6,852,926 | B2* | 2/2005 | Ma et al. | 174/539 |
| 2003/0214029 | A1* | 11/2003 | Tao et al. | 257/723 |
| 2004/0041248 | A1 | 3/2004 | Harney et al. | |
| 2004/0041254 | A1 | 3/2004 | Long et al. | |
| 2004/0106294 | A1* | 6/2004 | Lee et al. | 438/691 |
| 2005/0167795 | A1* | 8/2005 | Higashi | 257/678 |
| 2006/0267109 | A1* | 11/2006 | Ohguro | 257/396 |
| 2007/0092179 | A1* | 4/2007 | Park et al. | 385/14 |

FOREIGN PATENT DOCUMENTS

| JP | 3514349 | 8/1997 |
| JP | 2001-257410 | 9/2001 |
| JP | 2002-043463 | 2/2002 |
| JP | 2004-296724 | 10/2004 |
| JP | 2005-262353 | 9/2005 |
| JP | 2005-285864 | 10/2005 |
| JP | 2005-538551 | 12/2005 |
| JP | 2006-038657 | 2/2006 |
| JP | 2006-102845 | 4/2006 |
| JP | 2006102845 A * | 4/2006 |

* cited by examiner

*Primary Examiner* — Evan Pert
*Assistant Examiner* — Selim Ahmed
(74) *Attorney, Agent, or Firm* — DLA Piper LLP (US)

(57) ABSTRACT

The present invention relates to a microelectromechanical device having a simple structure in which strains of the semiconductor substrate can be reduced. Both a semiconductor substrate 17 and a second substrate 14 are disposed to face a first main surface 13a of the first substrate 13 and connected to the first main surface 13a of the first substrate 13. With this structure, no internal line or side surface line is necessary, and the structure of the first substrate 13 can be simplified. The length of the line can be decreased to decrease the resistance of the line, and good electrical characteristics can be achieved at low energy consumption. The strains in the semiconductor substrate 17 can also be reduced.

15 Claims, 13 Drawing Sheets

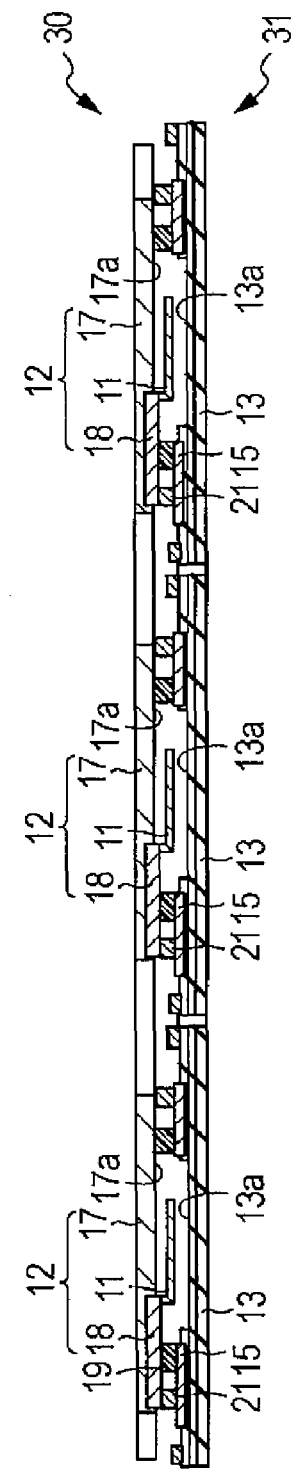

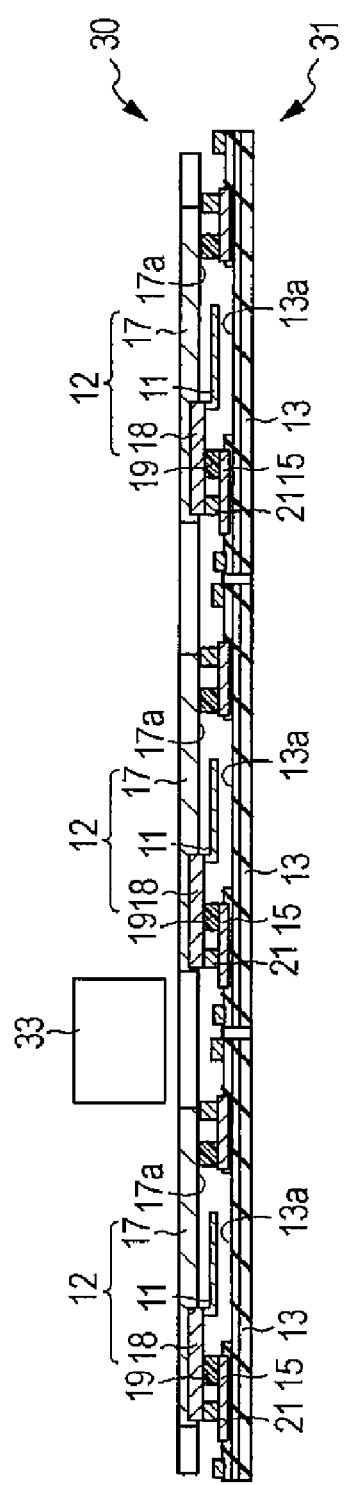

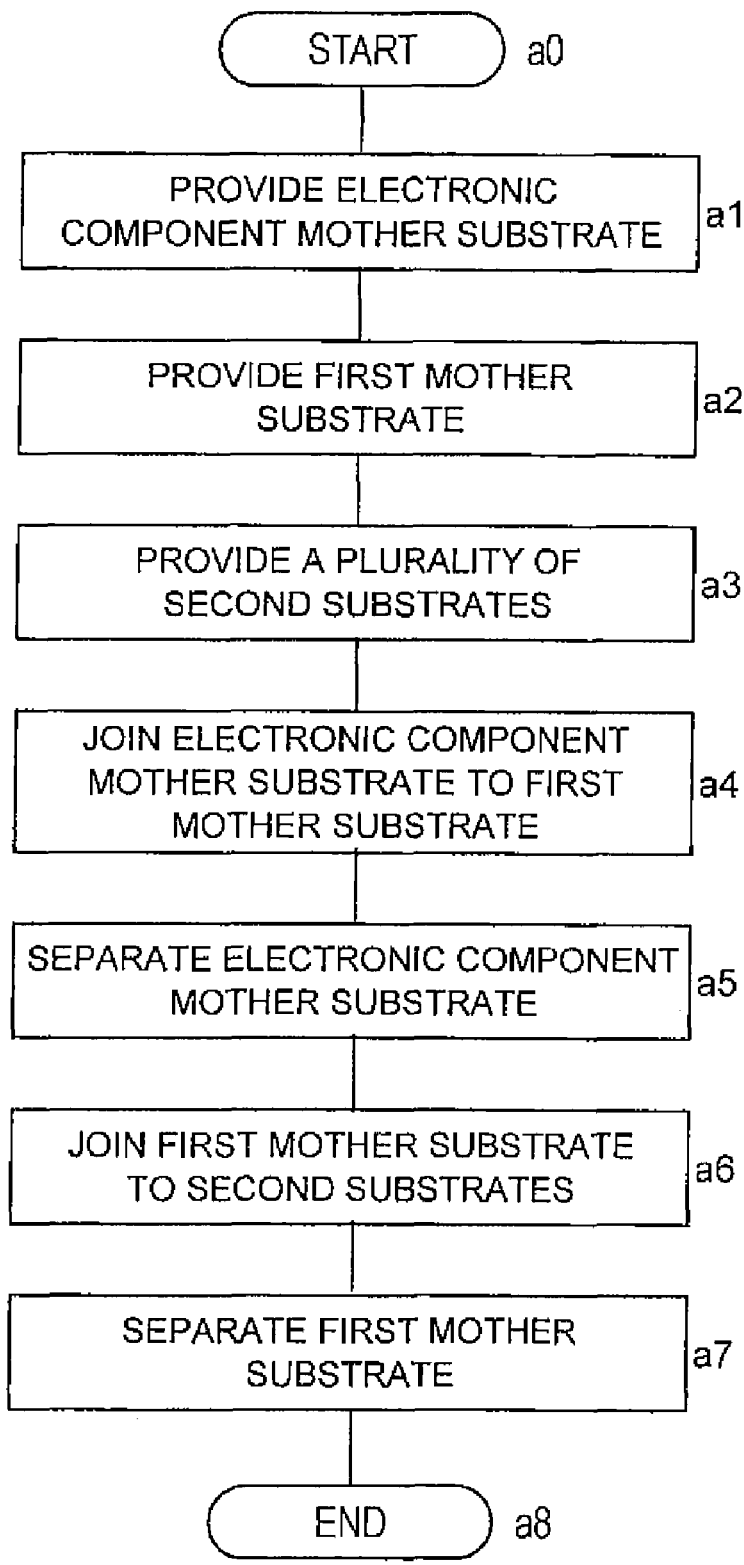

MICROELECTROMECHANICAL DEVICE AND METHOD FOR MANUFACTURING THE SAME

TECHNICAL FIELD

The present invention relates to a microelectromechanical device including a microelectromechanical system and a method for manufacturing the device.

BACKGROUND ART

FIG. 9 is a cross-sectional view of a microelectromechanical device (referred to as "electronic device" hereinafter) 1 of related art. The electronic device 1 is constituted by mounting an electronic component 5, which includes a microelectromechanical system (referred to as "MEMS" hereinafter) 3 and an electrode 4 disposed on a semiconductor substrate 2, onto a first substrate 6 also known as a covering substrate while sealing the MEMS 3. The electronic device 1 can achieve size reduction since the MEMS 3 is sealed with two substrate while being electrically connected to a wire 7 penetrating the first substrate 6 (for example, see Japanese Unexamined Patent Application Publication Nos. 2002-43463 and 2004-296724).

FIG. 10 is a cross-sectional view showing the state in which the electronic device 1 is mounted on a printed board 8. The electronic device 1 is mounted on the printed board 8 by bringing a main surface of the first substrate 6 remote from the semiconductor substrate 2 to face the printed board 8 also known as a circuit board. When the electronic device 1 is mounted on the printed board 8, thermal stresses are generated due to a large difference in thermal expansion coefficient between the printed board 8 and each of the substrates 2 and 6 of the electronic device 1, and strains are generated in the semiconductor substrate 2. If strains occur in the semiconductor substrate 2, the MEMS 3 is likely to exhibit degraded functions. The operation of the MEMS 3 is severely affected even by slight strains.

FIG. 11 is a cross-sectional view showing another state in which the electronic device 1 is mounted on the printed board 8. In order to reduce strains in the semiconductor substrate 2, a mount structure is employed as shown in FIG. 11, in which a second substrate 9, also known as "interposer" or the like, is interposed between the printed board 8 and the electronic device 1. A substrate that has a thermal expansion coefficient between that of the substrates 2 and 6 of the electronic device 1 and that of the printed board 8 is used as the second substrate 9, and this moderates the thermal stresses generated in the semiconductor substrate 2.

According to the structure shown in FIG. 11 including the second substrate 9, the electronic device 1 is arranged in such a way that a main surface of the first substrate 6 remote from the semiconductor substrate 2 faces the second substrate 9. Thus, in order to electrically connect the MEMS 3 to conductor line (not shown) formed on the printed board 8, wires 7 penetrating the first substrate 6 in the thickness direction must be formed. This renders the structure of the electronic device 1 more complex, which is a problem.

Although the strains in the semiconductor substrate 2 can be reduced to a certain degree by interposing the second substrate 9 between the electronic device 1 and the printed board 8, the degree of suppression is not sufficient. This is due to the following reason. The thermal expansion coefficient decreases in the order of the printed board 8, the second substrate 9, the first substrate 6, and the semiconductor substrate 2, that is, the thermal expansion coefficient decreases with an increase in distance from the printed board 8. Thus, in all of the substrates 2, 6, and 9, the expansion at a main surface of the substrate close to the printed board 8 is larger than the expansion at the other main surface. Thus, as shown in FIG. 12, the substrates warp upward in the direction away from the printed board 8. In other cases, the expansion at the main surface close to the printed board 8 is smaller than the expansion at the other main surface. In this case, as shown in FIG. 13, the substrates warp downward in the direction toward the printed board 8.

DISCLOSURE OF INVENTION

An object of the present invention is to provide an electronic device having a simple structure and a method for manufacturing the electronic device.

Another object of the present invention is to provide an electronic device in which strains in a semiconductor substrate can be reduced and a method for manufacturing the electronic device.

The present invention provides a microelectromechanical device including a microelectromechanical system, including:

an electronic component including a semiconductor substrate, the microelectromechanical system disposed on a first main surface of the semiconductor substrate and an electrode electrically connected to the microelectromechanical system;

a first substrate having a first main surface on which the electronic component is mounted with first connecting means so that the first main surface of the first substrate faces the first main surface of the semiconductor substrate;

a second substrate having a first main surface on which the first substrate is mounted through second connecting means so that the first main surface of the second substrate faces the first main surface of the first substrate;

a first conductor line disposed on the first main surface of the first substrate and electrically connected to the electrode of the semiconductor substrate at the first main surface of the first substrate; and a second conductor line disposed on the second substrate and electrically connected to the first conductor line at the first main surface of the first substrate.

In the present invention, a recess in which the microelectromechanical system is housed is formed in the first main surface of the first substrate.

In the present invention, the first connecting means surrounds the microelectromechanical system and seals the microelectromechanical system.

In the present invention, the second connecting means surrounds the electronic component and seals the electronic component.

In the present invention, the first connecting means contains a resin.

In the present invention, the resin is a benzocyclobutene resin.

In the present invention, the resin is a liquid crystal polymer.

In the present invention, the second connecting means contains a metal.

In the present invention, the metal contains at least one of a Au—Sn alloy, a Sn—Cu alloy, a Sn—Ag—Cu alloy, and a Pb—Sn alloy.

The present invention provides a microelectromechanical device including a microelectromechanical system, including:

an electronic component including a semiconductor substrate and a microelectromechanical system disposed on first main surface of a semiconductor substrate;

a first substrate having a first main surface on which the electronic component is mounted with first connecting means so that the first main surface of the first substrate faces the first main surface of the semiconductor substrate; and a second substrate having a first main surface on which the first substrate is mounted through second connecting means so that the first main surface of the second substrate faces the first main surface of the first substrate;

wherein a thermal expansion coefficient of the first substrate is smaller than a thermal expansion coefficient of the second substrate, and a thermal expansion coefficient of the semiconductor substrate is smaller than the thermal expansion coefficient of the first substrate.

In the present invention, the first substrate contains a material having a transparency, and the microelectromechanical system is an optical microelectromechanical system.

In the present invention, a semiconductor logic circuit is mounted on the microelectromechanical system.

In the present invention, the semiconductor logic circuit is mounted on the second substrate.

In the present invention, the semiconductor logic circuit is mounted on the first main surface of the second substrate and faces the semiconductor substrate.

The present invention provides a method for manufacturing a microelectromechanical device, including:

providing an electronic component mother substrate comprising a plurality of electronic component portions are arranged on a first main surface of a semiconductor substrate, each electronic component portion including a microelectromechanical system and an electrode electrically connected to the microelectromechanical system;

providing a first mother substrate comprising a plurality of first substrate portions, each of which including a first conductor line corresponding to the electronic component portion;

providing a second mother substrate comprising a plurality of second substrate portions, each of which includes a second conductor line corresponding to the first substrate portion;

making a first main surface of the electronic component mother substrate and a first main surface of the first mother substrate face each other to electrically connect the electrodes of the electronic component portions to the first conductor lines of the corresponding first substrate portions, and joining the first main surfaces of the semiconductor substrates of the electronic component portions to the first main surfaces of the corresponding first substrate portions through first connecting means;

separating the electronic component mother substrate into the electronic component portions;

making the first main surface of the first mother substrate and a first main surface of the second mother substrate face each other to electrically connect the first conductor lines of the first substrate portions to the second conductor lines of the corresponding second substrate portions, and joining the first main surfaces of the first substrate portions to the first main surfaces of the corresponding second substrate portions through second connecting means; and separating the first mother substrate into the first substrate portions and separating the second mother substrate into the second substrate portions to obtain individual microelectromechanical devices.

The present invention also provides a method for manufacturing a microelectromechanical device, including:

providing an electronic component mother substrate on which a plurality of electronic component portions are arranged on a first main surface of a semiconductor substrate, each electronic component portion including a microelectromechanical system and an electrode electrically connected to the microelectromechanical system;

providing a first mother substrate on which a plurality of first substrate portions, each of which includes a first conductor line corresponding to the electronic component portion;

providing a plurality of second substrates, each of which includes a second conductor line corresponding to the first substrate portion;

making a first main surface of the electronic component mother substrate and a first main surface of the first mother substrate face each other to electrically connect the electrodes of the electronic component portions to the first wire conductors of the corresponding first substrate portions, and joining the first main surfaces of the semiconductor substrates of the electronic component portions to the first main surfaces of the corresponding first substrate portions through first connecting mean;

separating the electronic component mother substrate into the electronic component portions;

making the first main surface of the first mother substrate and first main surfaces of the second substrates face each other to electrically connect the first conductor lines of the first substrate portions to the second conductor lines of the corresponding second substrate portions, and joining the first main surfaces of the first substrate portions to the first main surfaces of the corresponding second substrates through second connecting means; and separating the first mother substrate into the first substrate portions to obtain individual microelectromechanical devices.

According to the present invention, an electronic component includes a semiconductor substrate, a microelectromechanical system disposed on the semiconductor substrate and an electrode disposed on the semiconductor substrate, the electronic component is mounted on a first substrate, the first substrate with the electronic component mounted thereon is mounted on a second substrate, and a microelectromechanical device includes the electronic component and the first substrate and the second substrate. The first conductor line is formed on a first main surface of the first substrate and this first conductor line electrically connects the electrode on the semiconductor substrate to a second conductor line formed on the second substrate. With this structure, the microelectromechanical device is mounted on a target substrate, such as a printed board, by electrically connecting the second conductor line to a conductor line on the target substrate. Thus, the microelectromechanical system can be satisfactorily electrically connected to the conductor line of the target substrate and mounted on the target substrate while the microelectromechanical device maintains high reliability.

An electronic component is mounted on the first substrate while making a first main surface of a semiconductor substrate on which a microelectromechanical system is provided and a first main surface of the first substrate face each other. The first substrate is mounted on the second substrate while making the first main surface of the first substrate and a first main surface of the second substrate face each other. Since both the semiconductor substrate and the second substrate are connected to the first main surface of the first substrate, internal line or side surface line is less necessary, and the line should be likely formed on the first main surface of the first substrate only. Thus, the length of the wire for electrically connecting the electrode electrically connected to the microelectromechanical system to the line on the target substrate can be shortened and the resistance of the wire can be decreased. Thus, an electronic device having good electrical characteristics at low power consumption can be obtained. Since the electronic device 1 is formed on only the first main surface of the first substrate, the structure of the first conductor line can be simplified and the first conductor line can be easily manufactured.

According to the present invention, since a recess is formed in the first main surface of the first substrate and a microelectromechanical system is housed in the recess, the height of the first connecting means that joins the semiconductor substrate to the first substrate can be decreased. Thus, the height of the microelectromechanical device can be decreased, and size thereof can be reduced.

According to the present invention, first connecting means surrounds and seals the microelectromechanical system. Accordingly, the microelectromechanical system can be satisfactorily sealed.

According to the present invention, second connecting means surrounds and seals an electronic component. Accordingly, the microelectromechanical system can be satisfactorily sealed.

According to the present invention, since the first connecting means contains a resin, the semiconductor substrate can be joined to the first substrate by heating treatment at a relatively low temperature.

According to the present invention, the resin contained in the first connecting means is benzocyclobutene resin. The semiconductor substrate can be joined to the first substrate by heat treatment at a relatively low temperature using the benzocyclobutene resin so that the microelectromechanical system is not adversely affected by the heat. Moreover, since the benzocyclobutene resin is a thermosetting resin, the first connecting means is less likely to soften and the joined portions is likely to remain joined even when heat treatment is conducted after joining is conducted with the first connecting means, e.g., when joining with the second conductor line is conducted or when the microelectromechanical device is mounted on the target substrate.

According to the present invention, the resin contained in the first connecting means is a liquid crystal polymer. Compare to, for example, frit glass, the liquid crystal polymer can be used to join the semiconductor substrate to the first substrate by heat treatment at a relatively low temperature so that the microelectromechanical system is not adversely affected by the heat. As for the joining method, for example, a thermo compression welding with a wafer bonder apparatus or the like can be employed to securely join the substrates at a relatively low temperature. Although the liquid crystal polymer is a thermoplastic resin, the liquid crystal polymer does not completely melt and retains its shape with a decrease in viscosity when heat treatment is conducted after joining with the first connecting means is conducted, e.g., when joining is conducted with the second connecting means or the microelectromechanical system is mounted on the target substrate. Thus, the portions joined with the first connecting means remain joined.

According to the present invention, the second connecting means contains a metal. The electronic component can be satisfactorily sealed when such second connecting means is provided to surround the electronic component.

According to the present invention, the metal contained in the second connecting means contains at least one of a Au—Sn alloy, a Sn—Cu alloy, a Sn—Ag—Cu alloy, and a Pb—Sn alloy. These metals have a relatively low melting point. Thus, after the semiconductor substrate is joined to the first substrate with the first connecting means containing a resin, the first substrate can be joined to the second substrate with the second connecting means by conducting heat treatment at a low temperature so that the portions joined with the first connecting means remain joined.

According to the present invention, a electronic component includes a semiconductor substrate and a microelectromechanical system, the microelectromechanical system is disposed on the semiconductor substrate, the electronic component is mounted on a first substrate, the first substrate with the electronic component mounted thereon is mounted on a second substrate, and a microelectromechanical device includes the semiconductor substrate and the first substrate and the second substrate. The substrates constituting the microelectromechanical device have thermal expansion coefficients that decrease in the order of the second substrate, the first substrate, and the semiconductor substrate. Thus, the difference in thermal expansion coefficient between the substrates mechanically connected to each other can be reduced, and strains in the semiconductor substrate caused by thermal stress can be reduced. Moreover, the semiconductor substrate having a thermal expansion coefficient smaller than that of the first substrate and the second substrate having a thermal expansion coefficient larger than that of the first substrate are mechanically connected to the first main surface of the first substrate, the bending moment applied to the first substrate caused by the difference in thermal expansion coefficient between the first substrate and the semiconductor substrate cancels the bending moment applied to the first substrate caused by the difference in thermal expansion coefficient between the first substrate and the second substrate. Thus, the warpage of the first substrate can be reduced, and the warpage of the entire microelectromechanical device can be reduced. Therefore, the warpage of the semiconductor substrate can be reduced, the strains in the semiconductor substrate can be reduced, and the microelectromechanical system can be satisfactorily maintained in an operable state.

According to the present invention, the first substrate contains a material having a transparency, and the microelectromechanical system is an optical microelectromechanical system. A preferable optical device which can be easily mounted on a target substrate can be obtained by disposing the semiconductor substrate at the second substrate-side of the first substrate and using a substrate composed of a material having a transparency as the first substrate. For example, the optical device may be a device called digital mirror device or digital micromirror device.

According to the present invention, a semiconductor logic circuit is mounted in the microelectromechanical system. In this manner, the electronic component and the semiconductor logic circuit can be integrated and the size of the microelectromechanical device can be reduced.

According to the present invention, the semiconductor logic circuit is mounted on the second substrate. With this structure, the semiconductor logic circuit can be thermally isolated from the microelectromechanical system and ill effects on the microelectromechanical system caused by heat from the semiconductor logic circuit can be effectively reduced.

According to the present invention, the semiconductor logic circuit is mounted on the first main surface of the second substrate by facing the semiconductor substrate. With this structure, the semiconductor substrate and the semiconductor logic circuit can be disposed at nearly symmetrical positions, and the strains in the microelectromechanical system can be more effectively reduced.

According to the present invention, the electronic component mother substrate comprising a plurality of electronic component portions is joined to the first mother substrate comprising a plurality of first substrate portions with the first connecting means, and the electronic component mother substrate is separated into the electronic component portions. Only the electronic component mother substrate is separated, and the first mother substrate remains unseparated. In such a state, the first substrate is joined to the second substrate comprising a plurality of second substrate portions with the second connecting means. Then the first and second mother substrates are separated to obtain microelectromechanical devices.

As described above, a plurality of microelectromechanical devices can be easily and assuredly manufactured. Since the microelectromechanical system remains sealed during separating the electronic component mother substrate, the first mother substrate, and the second mother substrate, cutting dust from the semiconductor substrate such as silicon that arises during separating does not deposit on the microelectromechanical system, and the resulting microelectromechanical system of the microelectromechanical device is less likely to cause malfunction. Thus, microelectromechanical device that operates satisfactorily can be obtained.

According to the present invention, the electronic component mother substrate comprising a plurality of electronic component portions is joined to the first mother substrate comprising a plurality of first substrate portions with the first connecting means, and the electronic component mother substrate is separated into the electronic component portions. Only the electronic component mother substrate is separated, and the first mother substrate remains as is without being separated. In such a state, the first substrate is joined to a plurality of second substrates with the second connecting means. Then the first mother substrate is separated to obtain microelectromechanical devices.

As described above, a plurality of microelectromechanical devices can be easily and securely manufactured. Since the microelectromechanical system remains sealed during separating the electronic component mother substrate and the first mother substrate, cutting dust from the semiconductor substrate such as silicon that arises during separating does not deposit on the microelectromechanical system, and the resulting microelectromechanical system of the microelectromechanical device is less likely to cause malfunction. Thus, microelectromechanical device that operates satisfactorily can be obtained.

BRIEF DESCRIPTION OF DRAWINGS

The objects, features, and advantages of the present invention will become readily apparent from the following detailed description and the accompanying drawings.

FIGS. 6A to 6D are cross-sectional views illustrating the manufacturing steps shown in FIG. 5.

FIG. 7 is another flowchart showing the steps of manufacturing the electronic device 10 according to the manufacturing method of the present invention.

BEST MODES FOR CARRYING OUT THE INVENTION

Preferred embodiments of the present invention will now be described in detail with reference to the drawings.

Figure 1:
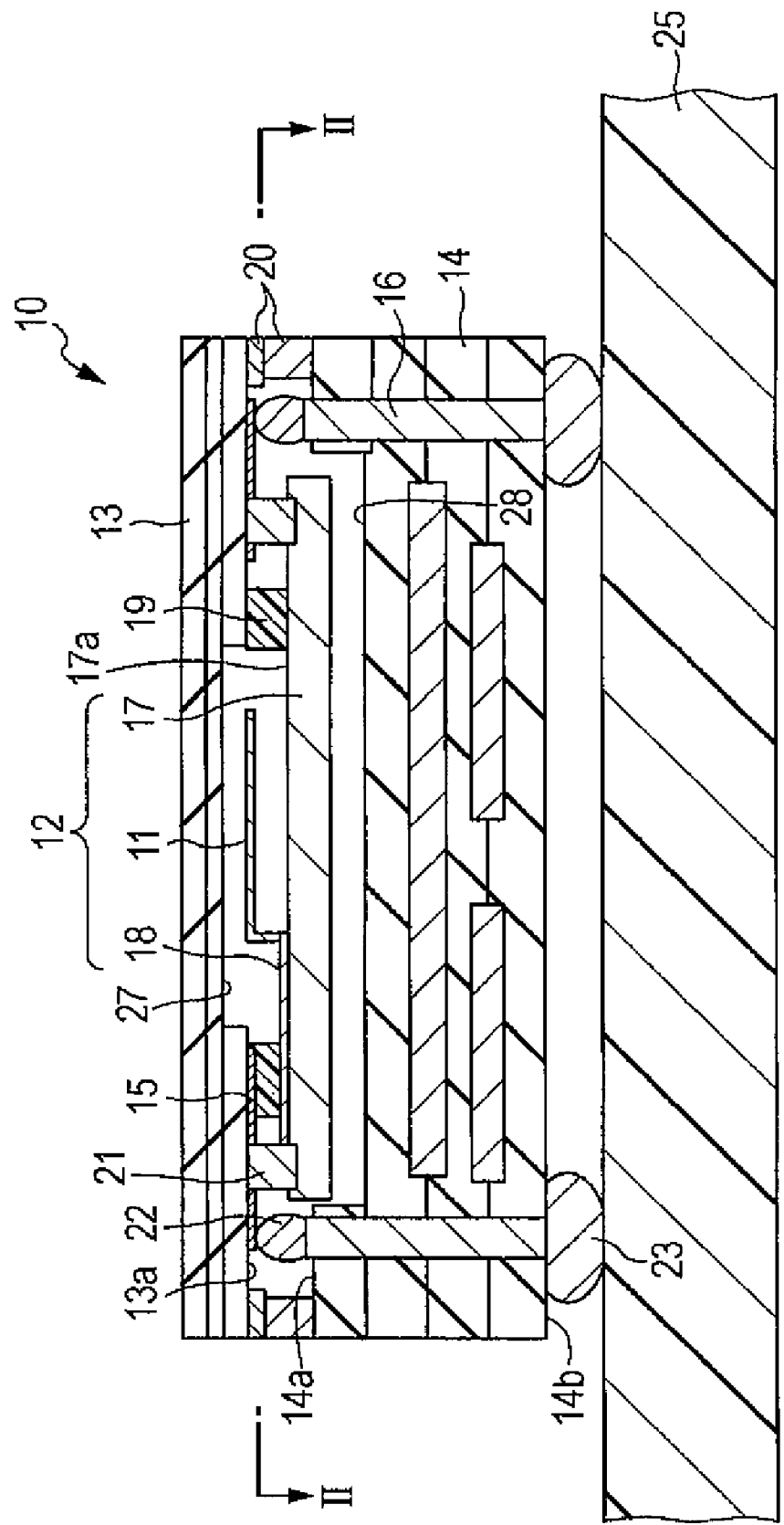
FIG. 1 is a cross-sectional view of an electronic device 10 according to one embodiment of the present invention.
Figure 2:
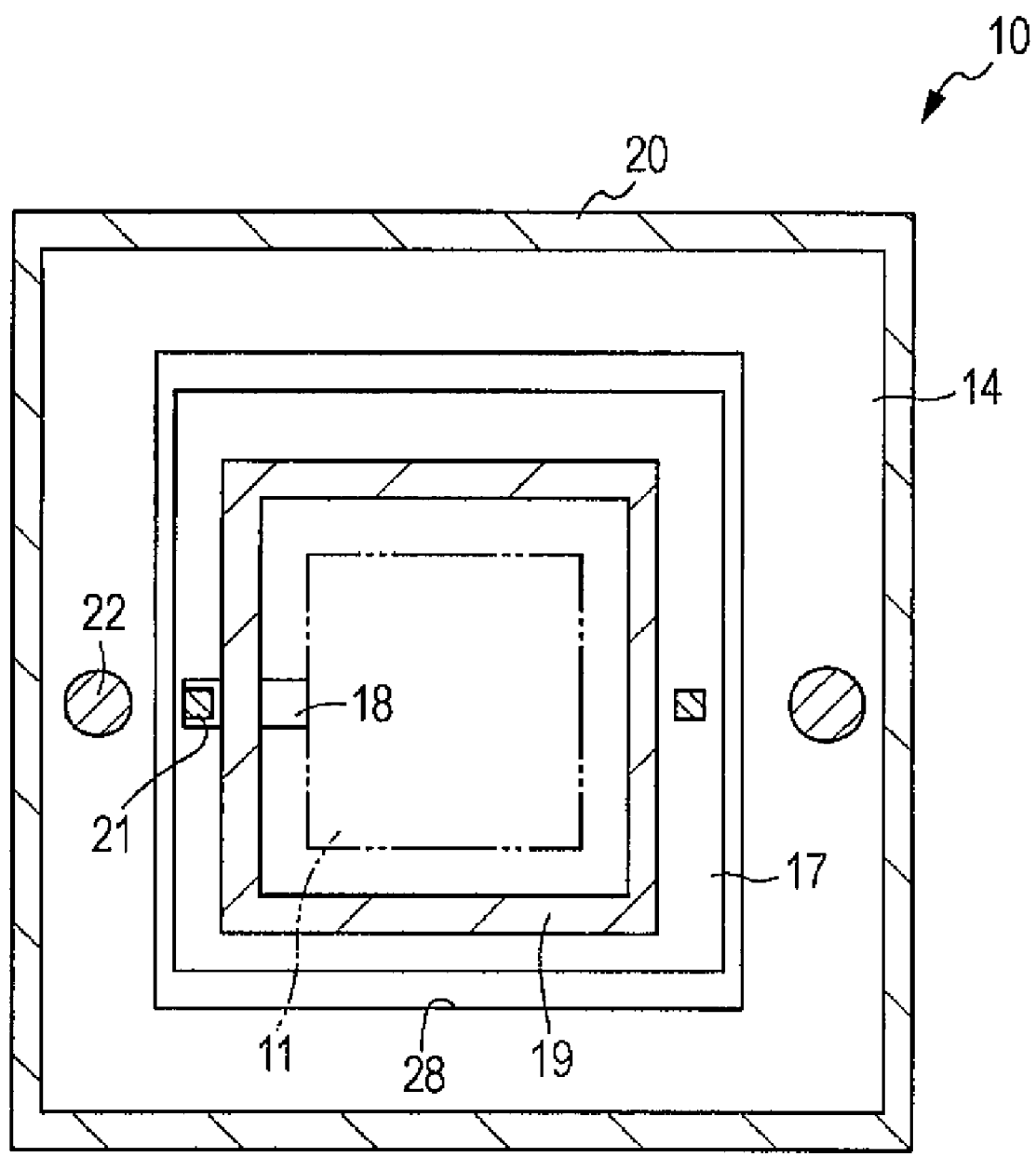
FIG. 2 is a cross-sectional view taken along line II-II in FIG. 1.

FIG. 1 is a cross-sectional view of a microelectromechanical device (referred to as "electronic device" hereinafter) 10 according to one embodiment of the present invention. FIG. 2 is a cross-sectional view taken along line II-II in FIG. 1. FIG. 2 shows a cross-section taken along a plane perpendicular to the thickness direction of substrates 13, 14, and 17 described below. Mainly referring to FIG. 1, the electronic device 10 includes a microelectromechanical system (referred to as "MEMS" hereinafter) 11. The MEMS 11 is an electromechanical system constituted by micro components (microscale devices) manufactured by making full use of semiconductor fine processing technology. An electronic device 10 including the MEMS 11 is used in a wide variety of field, including sensors such as accelerometers and pressure sensors, optical devices such as micromirror devices with adjustable micro mirror components, microchemical systems, a.k.a., microchemical chips, incorporating micro pumps, and other devices.

The electronic device 10 includes an electronic component 12, a first substrate 13, a second substrate 14, a first conductor line 15, and a second conductor line 16. The MEMS 11 is built inside the electronic component 12, sealed in such a way that the MEMS 11 is electrically connectable to an external device, and installed in the electronic device 10.

The electronic component 12 includes MEMS 11 on a first main surface 17a of the semiconductor substrate 17 and an electrode 18 electrically connected to the MEMS 11. The electrode 18 is also disposed on the first main surface 17a of the semiconductor substrate 17. A "main surface" refers to one of two surfaces in the thickness direction. As shown in FIG. 2, the semiconductor substrate 17 has an oblong shape when viewed in the thickness direction and is made of a single crystal or polycrystal silicon substrate.

The first substrate 13 is a substrate arranged to have a first main surface 13a face the first main surface 17a of the semiconductor substrate 17 and is also called a covering substrate. The electronic component 12 is mounted on the first main surface 13a of the first substrate 13 through a first joining member 19, which is first connecting means. The first main surface 17a of the semiconductor substrate 17 is joined to the first main surface 13a of the first substrate 13 with the first joining member 19 to mechanically connect the electronic component 12 to the first substrate 13.

The first substrate 13 has an oblong shape when viewed in the thickness direction and is larger than the semiconductor substrate 17. When projected onto the plane of paper of FIG. 2, the portion of the first substrate 13 is coincident with the portion of the second substrate 14. The first substrate 13 serves as a lid for sealing the MEMS 11 and as a base member for forming the first conductor line 15 and the first joining member 19. The first joining member 19 is formed into an annular shape so that the first joining member 19 has no ends, surrounds the MEMS 11, and hermetically seals the MEMS 11 together with the first substrate 13. As shown in FIG. 2, the first joining member 19 is formed into a rectangular frame, and the semiconductor substrate 17 and the first substrate 13 protrude outward from the first joining member 19 throughout the entire periphery.

The first substrate 13 may have a single layer structure or a multilayer structure. The first substrate 13 is composed of an insulating material, e.g., a ceramic materials an organic resin material, or a composite material. Examples of the ceramic material include sintered aluminum oxide, sintered aluminum nitride, sintered mullite, sintered silicon carbide, sintered silicon nitride, and sintered glass ceramics. Examples of the organic resin material include polyimide and glass epoxy resins. The composite material is, for example, a material in which an inorganic powder of ceramic, glass, or the like, is bonded with an organic resin such as epoxy resin. The first substrate 13 may be composed of glass.

For example, a first substrate 13 composed of sintered aluminum oxide is formed by preparing a plurality of green sheets from raw material powder of aluminum oxide and glass powder, stacking the green sheets, and sintering the stacked green sheets. The first substrate 13 is not limited to that formed of sintered aluminum oxide. A material that suits the usage and the characteristics of the electronic component 12 to be hermetically sealed is preferably selected.

For example, since the first substrate 13 is joined to the semiconductor substrate 17 with the first joining member 19, in order to increase the reliability of joining to the semiconductor substrate 17, i.e., the hermetic of sealing the MEMS 11, the first substrate 13 is preferably composed of a material having a thermal expansion coefficient not largely different from the thermal expansion coefficient of the semiconductor substrate 17. Examples of such a material include sintered mullite and sintered glass ceramics, such as an aluminum oxide-borosilicate glass-based glass ceramic, in which the thermal expansion coefficient is adjusted to be close to the thermal expansion coefficient of the semiconductor substrate 17 by controlling the type and amount of the glass component.

For example, in order to reduce delay of electrical signals transmitted through wires such as the first conductor line 15 formed on the first substrate 13, the first substrate 13 is preferably composed of a material having a low relative dielectric constant, e.g., organic resin materials such as polyimide and glass epoxy resin, composite materials in which inorganic powder such as ceramic and glass is bonded with an organic resin such as epoxy resin, and sintered glass ceramics such as aluminum oxide-borosilicate glass-based and lithium oxide-based sintered glass ceramics.

For example, in the case where the sealed MEMS 11 generates much heat and this heat is to be rapidly radiated to the exterior, the first substrate 13 is preferably composed of a material having a high thermal conductivity, such as aluminum nitride-based sintered materials.

The second substrate 14 is a substrate arranged to have a first main surface 14a face the first main surface 13a of the first substrate 13 and is also called "interposer" or the like. The first substrate 13 is mounted on the first main surface 14a of the second substrate 14 through a second joining member 20, which is second connecting means. The electronic component 12 is sandwiched between the first substrate 13 and the second substrate 14, the first main surface 13a of the first substrate 13 is joined to the first main surface 14a of the second substrate 14 with the second joining member 20, and the first substrate 13 is mechanically connected to the second substrate 14.

As shown in FIG. 2, the second substrate 14 has an oblong shape when viewed in the thickness direction. The second substrate 14 functions as a covering member for sealing the electronic component 12 together with the first substrate 13 and also serves as a base member for forming the second conductor line 16. The second joining member 20 is formed into an annular shape so that the second joining member 20 has no end, surrounds the electronic component 12, and hermetically seals the MEMS 11 together with the first substrate 13 and the second substrate 14. As shown in FIG. 2, the second joining member 20 is formed into a rectangular frame and joins the outermost peripheral portions of the first substrate 13 and the second substrate 14 to each other.

The second substrate 14 may have a single layer structure or a multilayer structure. The second substrate 14 is composed of the same insulating material as the first substrate 13.

For example, a second substrate 14 composed of an aluminum oxide-based sintered material is formed by preparing a plurality of green sheets from raw material powder of aluminum oxide and glass powder, stacking the green sheets, and sintering the stacked green sheets. The second substrate 14 is not limited to that formed of an aluminum oxide-based sintered material. A material that suits the usage and the characteristics of the electronic component 12 to be hermetically sealed is preferably selected.

For example, since the second substrate 14 is to be joined to the first substrate 13 through the second joining member 20, the second substrate 14 may be composed of a sintered glass ceramic (aluminum oxide-borosilicate glass-based glass ceramic) in which borosilicate glass is added to an alumina filler, to enhance the reliability of joining to the first substrate 13 and the reliability of joining to the printed board 8. In such a case, the thermal expansion coefficient of the second substrate 14 is preferably between the thermal expansion coefficient of the first substrate 13 and the thermal expansion coefficient of the printed board 2. For example, when the first substrate 13 is a pyrex (registered trade name) glass substrate, the thermal expansion coefficient of the second substrate is preferably about 5 ppm/° C. or more and about 10 ppm/° C. or less.

For example, in order to reduce delay of electrical signals transmitted through wires such as the second conductor line 16 formed in the second substrate 14, the second substrate 14 is preferably composed of an inorganic material such as ceramic or glass, in particular, a sintered glass ceramic. For example, an aluminum oxide-borosilicate glass-based glass ceramic has a low dielectric dissipation factor and allows use of a low-resistance conductor material such as copper, silver, gold, or the like as the conductor line. Thus, the second substrate 14 exhibits good high frequency characteristics.

For example, in the case where MEMS 11 in the electronic component 12 to be sealed generates much heat and the heat is to be rapidly radiated to the exterior, the second substrate 14 is preferably composed of a material having a high thermal conductivity, such as an aluminum nitride-based sintered material.

The first and second joining members 19 and 20 are composed of a metal material, an inorganic material, a resin material, or the like. Examples of the metal material used in the first and second joining members 19 and 20 are solders such as tin-silver and tin-silver-copper solders, and brazing alloys such as a gold-tin brazing alloy. Examples of the inorganic material for the first and second joining members 19 and 20 include glass materials such as PbO—$SiO_2$—$B_2O_3$—R, $Bi_2O_3$—$SiO_2$—R, and ZnO—$SiO_2$—$B_2O_3$—R (where R is an oxide of an alkali metal or an oxide of an alkaline earth metal). When the semiconductor substrate 17 is a silicon substrate, in order to make the thermal expansion coefficient of the semiconductor substrate 17 close to the thermal expansion coefficient of the first joining member 19 and second joining member 20, a low thermal expansion filler (cordierite: $2MgO.2Al_2O_3.5SiO_3$, zirconium tungstate phosphate: $Zr2WO_4(PO_4)_2$, zirconium phosphate: $(ZrO)_2P_2O_7$, or β quartz: $SiO_2$) may be mixed into a glass material. The resin material for the first and second joining members 19 and 20 may be a thermosetting or thermoplastic resin, e.g., epoxy resin, silicone resin, benzocyclobutene resin, polyimide resin, or liquid crystal polymer.

The first and second joining members 19 and 20 may include a seal ring. A seal ring with joining members attached on the upper and lower surfaces can be considered as the first and second joining members 19 and 20. In such a case, the joining member is composed of the materials described above. The seal ring is composed of a metal material, an inorganic material, a resin material, or the like. Examples of the metal material for the seal ring include iron-nickel-based alloys such as iron-nickel-cobalt alloys and iron-nickel alloys, oxygen-free copper, aluminum, stainless steel, copper-tungsten alloys, and copper-molybdenum alloys. Examples of the inorganic material for the seal ring include aluminum oxide-based sintered materials and sintered glass ceramics. Examples of the resin material for the seal ring include organic resin-based materials such as polytetrafluoroethylene (PTFE) and glass epoxy resin, and other types of resin. When such a seal ring is included, a cavity for housing the MEMS 11 or the electronic component 12 can be easily formed between the semiconductor substrate 17 and the first substrate 13 or between the first substrate 13 and the second substrate 14.

Examples of the method for joining the first and second joining members 19 and 20 to the substrate 13, 14, and 17 include a joining method using a solder such as a tin-silver-based solder or a brazing alloy such as a gold-tin brazing alloy in a common reflow furnace, and a thermal compression joining method using a wafer bonding apparatus or the like.

The first conductor line 15 is formed on the first main surface 13a of the first substrate 13 and is electrically connected to the electrode 18 formed on the first main surface 17a of the semiconductor substrate 17 through a first connecting terminal 21. As a result, the first conductor line 15 is electrically connected to the electrode 18 of the electronic component 12 at the first main surface 13a of the first substrate 13. In this embodiment, as shown in FIG. 2, two first connecting terminals 21 are disposed at the outer side of the first joining member 19 and sandwich the first joining member 19.

As shown in FIG. 2, the electronic component 12 is disposed at the inner side of the second joining member 20 and sealed, and the first conductor line 15 is connected to the electrode 18 at the outer side of the first joining member 19. As a result, the first joining member 19 can be disposed at a position as inward as possible. Since the first joining member 19 that mechanically connects the semiconductor substrate 17 to the first substrate 13 is disposed at the inner side, thermal stresses generated in the semiconductor substrate 17 due to the difference in thermal expansion coefficient between the semiconductor substrate 17 and the first substrate 13 can be decreased as much as possible and thus the strains in the semiconductor substrate 17 can be reduced as much as possible.

The first conductor line 15 may be connected to the electrode 18 at the inner side of the first joining member 19. In such a case, the electrode 18 and the connecting part of the first conductor line 15 are satisfactorily sealed and protected with the first joining member 19. Thus, good electrical connections can be maintained.

Second conductor lines 16 are formed in the second substrate 14 by penetrating through the first main surface 14a of the second substrate 14 to a second main surface 14b in the thickness direction. A portion of the second conductor line 16 exposed at the first main surface 14a of the second substrate 14 is electrically connected to the first conductor line 15 formed on the first main surface 13a of the first substrate 13 through a second connecting terminal 22. As a result, the second conductor line 16 is electrically connected to the first conductor line 15 at the first main surface 13a of the first substrate 13.

In this embodiment, as shown in FIG. 2, two second connecting terminals 22 are disposed at the inner side of the second joining member 20 and sandwich the two first connecting terminals 21. The first connecting terminals 21 and the second connecting terminals 22 are all aligned on a straight line passing the center of the MEMS 11 when projected onto the plane of the paper of FIG. 2.

As shown in FIG. 2, the second conductor line 16 is connected to the first conductor line 15 at the inner side of the second joining member 20. As a result, the connecting portions of the first and second conductor lines and 16 are sealed and protected. Thus, good electrical connections can be maintained.

Alternatively, the second conductor line 16 may be connected to the first conductor line 15 at the outer side of the second joining member 20. In such a case, the second joining member 20 can be disposed at a position as inward as possible. Since the second joining member 20 mechanically connecting the second substrate 14 to the first substrate 13 is disposed at the inner side, thermal stresses generated in the first substrate 13 due to the difference in thermal expansion coefficient between the second substrate 14 and the first substrate 13 can be decreased as much as possible and thus the strains in the first substrate 13 can be reduced as much as possible.

This electronic device 10 is mounted on a printed board 25 while having the second main surface 14b of the second substrate 14 face the printed board 25. Line not shown in the drawing is formed on the printed board 25, and a portion of the second conductor line 16 exposed at the second main surface 14b of the second substrate 14 is electrically connected to the pattern of the printed board 25 through a third connecting terminal 23. As a result, the MEMS 11 is electrically connected to an external electronic circuit, such as another electronic circuit mounted on the printed board 25. The electronic device 10 is mechanically connected to the printed board 25 with the third connecting terminal 23. Thus, the electronic device 10 is electrically and mechanically connected to the printed board 25 with the third connecting terminal 23 and mounted on the printed board 25.

It should be noted that the second conductor line 16 does not have to penetrate the second substrate 14 and may be formed at a side surface of the second substrate 14. Alternatively, the second conductor line 16 may be extended to a position on the first main surface 14a of the second substrate 14 at the outer side of the first substrate 13 so that the electronic device 10 can be mounted on the printed board 25 while making the first main surface 13a of the first substrate 13 and the printed board 25 face each other.

The printed board 25 is also called a line substrate or board, and is a target substrate on which the electronic device 10 is to be mounted. The printed board 25 is constituted by, for example, a main body composed of an insulating material such as epoxy resin and a line composed of a conductive material disposed on the main body.

The first and second conductor lines 15 and 16 and the electrode 18 are composed of a conductive material, e.g., a metal material such as copper, silver, gold, palladium, tungsten, molybdenum, or manganese. The first and second conductor lines 15 and 16 are formed as metal thin films. For example, they can be formed by depositing metal thin films by metallizing, plating, or vapor-deposition. For example, in order to form a first conductor line 15 made of a tungsten thin film by metallization, a tungsten paste is applied on a green sheet which will form the first substrate 13, and sintered together with the green sheet.

The first to third connecting terminals 21 to 23 are composed of a conductive material, e.g., a solder such as a tin-silver-based solder or a tin-silver-copper-based solder, a low-melting-point brazing alloy such as a gold-tin brazing alloy, a high-melting-point brazing alloy such as a silver-germanium-based brazing alloy, a conductive organic resin, and a weldable metal material that can be welded through various welding techniques such as seam welding and electron beam welding.

According to such a electronic device 10, the electronic component 12 is arranged in such a way that the semiconductor substrate 17 faces the first main surface 13a of the first substrate 13, the first substrate 13 is arranged in such a way that its first main surface 13a faces the first main surface 14a of the second substrate 14, and the semiconductor substrate 17 and the second substrate 14 are thereby electrically and mechanically connected to the first main surface 13a of the first substrate 13. According to this structure, there is no need to provide internal line or side surface line to the first substrate 13, and line should be formed on the first main surface 13a only. The first conductor line 15 is formed only on the first main surface 13a of the first substrate 13. Thus, the length of the wire electrically connecting the electrode 18 electrically connected to the MEMS 11 to the line of the printed board 25 can be reduced, and the resistance of the wire can be decreased. Thus, the electronic device 10 can achieve good electrical characteristics at low power consumption. The structure of the electronic device 10 can also be simplified and the electronic device 10 can be easily manufactured.

A recess 27 is formed in the first main surface 13a of the first substrate 13 to house the MEMS 11. Since the recess 27 for housing the MEMS 11 that protrudes from the semiconductor substrate 17 compared to the electrode 18 and the like is formed in the first substrate 13, the heights of the first joining member 19 and the first connecting terminals 21, i.e., the dimension in the thickness direction of the semiconductor substrate 17, the first substrate 13, and the like, can be decreased.

Another recess 28 is formed in the first main surface 14a of the second substrate 14 to house the electronic component 12. Since the recess 28 for housing the electronic component 12 that protrudes from the first substrate 13 compared to the first conductor line 15 and the like is formed in the second substrate 14, the heights of the second joining member 20 and the second connecting terminals 22, i.e., the dimension in the thickness direction of the first and second substrates 13 and 14 and the like, can be decreased.

Forming the recesses 27 and 28 in the first and second substrates 13 and 14 to reduce the heights of the first and second joining members 19 and 20 and the first and second connecting terminals 21 and 22 can decrease the dimension of the electronic device 10 in the thickness direction. These recesses 27 and 28 are not essential features. A structure in which none or one of the recesses 27 and 28 is formed is also possible. As long as one of the recesses 27 and 28 is formed, the dimension in the thickness direction can be decreased compared to a structure in which none of the recesses 27 and 28 is formed.

The first joining member 19 is formed into an annular shape so that the first joining member 19 has no ends, surrounds the MEMS 11, and seals the MEMS 11. The electronic component 12 is interposed between the first and second substrate 13 and 14, and the second joining member 20 is formed into an annular shape so that the second joining member 20 has no ends, surrounds the electronic component 12 including the MEMS 11, and seals the electronic component 12. Thus, the MEMS 11 is double surrounded and sealed with the first joining member 19 at the inner side and the second joining member 20 at the outer side, and thus the MEMS 11 can be satisfactorily sealed.

Joining members composed of various materials may be used as the first joining member 19. For example, a joining member composed of a resin is used. The resin may be thermoplastic or thermosetting as long as it can form a mechanical connection. A joining member composed of a resin may have lower sealing accuracy than a joining member composed of a metal. However, since the MEMS 11 is double sealed with the two joining members 19 and 20, a joining member composed of a resin can be used as the first joining member 19.

In the case where a joining member composed of a resin is used as the first joining member 19, the semiconductor substrate 17 can be joined to the first substrate 13 by heat treatment at a temperature lower than when glass or the like is used as the first joining member 19. Whereas the melting point of glass is 400° C. or higher, the first joining member 19 is preferably formed of, for example, a resin that has a melting point of 250° C. or more and 300° C. or less and that can join the semiconductor substrate 17 to the first substrate 13 by heat treatment at a temperature of 300° C. or lower. When the first joining member 19 composed of such a resin is used, the electronic component 12 can be mounted on the first substrate 13 by joining the semiconductor substrate 17 to the first substrate 13 while reducing ill effects on the MEMS 11 and the like caused by heat.

When the first joining member 19 is composed of a resin, the first joining member 19 can be directly attached onto the first conductor line 15. In other words, if a conductive material such as a solder is used to form the first joining member 19, an insulating body must be provided between the first conductor line 15 and the first joining member 19 composed of the conductive material to prevent shorting with the first conductor line 15. However, when the first joining member 19 is composed of an insulating resin, there is no need to separately provide the insulating body.

As described below, the mechanical connection between the semiconductor substrate 17 and the first substrate 13 with the first joining member 19 and the electrical connection between the semiconductor substrate 17 and the first substrate 13 with the first connecting terminal 21 are established together. Thus, when a resin is used to form the first joining member 19, the first connecting terminal 21 is preferably composed of a material that can establish an electrical connection by heat treatment at a temperature as low as possible. For example, the first connecting terminal 21 is preferably composed of a solder containing a tin-silver-copper (Sn—Ag—Cu)-based solder and a copper (Cu) filler, a lead-tin (Pb—Sn)-based high temperature solder, a tin-gold (Sn—Au) alloy-based material, or a Au material.

For example, the resin used as the material for the first joining member 19 is a benzocyclobutene resin. A benzocyclobutene resin can be used to join the semiconductor substrate 17 to the first substrate 13 by heat treatment at a temperature lower than that required for frit glass to reduce ill effects on the MEMS 11 caused by heat. Since the benzocyclobutene resin is a thermosetting resin, the first joining member 19 does not soften and the joined portions remain joined even when heat treatment is conducted in a subsequent process, such as when joining is conducted with the second joining member 20 or the electronic device 10 is mounted on the printed board 25, after joining is conducted with the first joining member 19.

For example, the resin used as the material for the first joining member 19 is a liquid crystal polymer. A liquid crystal polymer has a melting point lower than that of frit glass. Thus, the semiconductor substrate 17 can be joined to the first substrate 13 by heat treatment at a relatively low temperature while reducing ill effects on the MEMS 11 by heat. As for the joining method, for example, joining can be reliably conducted at a relatively low temperature by employing a thermo compression welding method using a wafer bonder apparatus or the like. Furthermore, although the liquid crystal polymer is a thermoplastic resin, it does not completely melt unlike a solder and retains its shape with a decrease in viscosity even when it is heated to a temperature near the melting point in the subsequent processes, such as when joining is conducted with the second connecting member 20 or when the electronic device 10 is mounted on the printed board 25, after joining is conducted with the first connecting means or the first joining member 19. Thus, the portions joined with the first joining member 19 remain joined.

Joining members composed of various materials may be used as the second joining member 20. For example, a joining member composed of a metal is used. The second joining member 20 composed of a metal and surrounding the electronic component 12 can satisfactorily seal the electronic component 12.

The metal used as the material for the second joining member 20 is, for example, a brazing alloy including a metal containing at least one of a gold-tin (Au—Sn)-based alloy, a tin-copper (Sn—Cu)-based alloy, a tin-silver-copper (Sn—Ag—Cu)-based alloy, and a lead-tin (Pb—Cu)-based alloy. These metals have relatively low melting points compared to other metals. Thus, a good sealing state can be achieved with the second joining member 20, and, after the semiconductor substrate 17 is joined to the first substrate 13 with the first joining member 19 composed of a resin, the first substrate 13 can be joined to the second substrate 14 with the second joining member 20 by conducting heat treatment at a low temperature while maintaining the portions joined with the first joining member 19.

As described below, the mechanical connection between the first substrate 13 and the second substrate 14 with the second joining member 20 and the electrical connection between the first substrate 13 and the second substrate 14 with the second connecting terminals 22 are established together. Thus, the second connecting terminals 22 are preferably composed of a material that can establish an electrical connection by heat treatment at a temperature substantially same as that required for the second joining member 20. For example, the second connecting terminals 22 are preferably composed of the same material as the second joining member 20.

The materials for the three substrates 13, 14, and 17 constituting the electronic device 10 are designed so that their thermal expansion coefficients gradually decrease along a mechanical connecting path as the distance from the printed board 25 increases. Thus, the thermal expansion coefficient of the second substrate 14 is smaller than the thermal expansion coefficient of the printed board 25, the thermal expansion coefficient of the first substrate 13 is smaller than the thermal expansion coefficient of the second substrate 14, and the thermal expansion coefficient of the semiconductor substrate 17 is smaller than the thermal expansion coefficient of the first substrate 13. The materials for the substrates 13, 14, 17, and 25 are selected from the materials described above to adjust the thermal expansion coefficients of the substrates 13, 14, 17, and 25 to satisfy such a relationship.

When the thermal expansion coefficients of the substrates 13, 14, 17, and 25 are designed to have such a relationship, the difference in thermal expansion coefficient between substrates mechanically connected to each other can be decreased, and strains caused by thermal stresses in the semiconductor substrate 17 can be reduced. Moreover, since the semiconductor substrate 17 having a thermal expansion coefficient smaller than that of the first substrate 13 and the second substrate 14 having a thermal expansion coefficient larger than that of the first substrate 13 are mechanically connected to the first main surface 13a of the first substrate 13, the bending moment applied to the first substrate 13 caused by the difference in thermal expansion coefficient between the first substrate 13 and the semiconductor substrate 17 cancels the bending moment applied to the first substrate 13 caused by the difference in thermal expansion coefficient between the first substrate 13 and the second substrate 14. Thus, the warpage of the first substrate 13 can be reduced, and the warpage of the entire electronic device 10 can be reduced. Therefore, the warpage of the semiconductor substrate 17 can be reduced, the strains in the semiconductor substrate 17 can be reduced, and the MEMS 11 can be satisfactorily maintained in an operable state.

The electronic device 10 can be used as an optical device when an optical microelectromechanical system for executing optical process operation is used as the MEMS 11 and the first substrate 13 is composed of a material having a transparency such as glass. In the electronic device 10, the electronic component 12 is interposed between the first substrate 13 and the second substrate 14. Hence, when the first substrate 13 is designed to have a transparency, the optical path for the MEMS 11 can be secured and the electronic device 10 can be used as a preferable optical device. For example, a device called digital mirror device or digital micromirror device can be obtained with this optical device.

Figure 3:
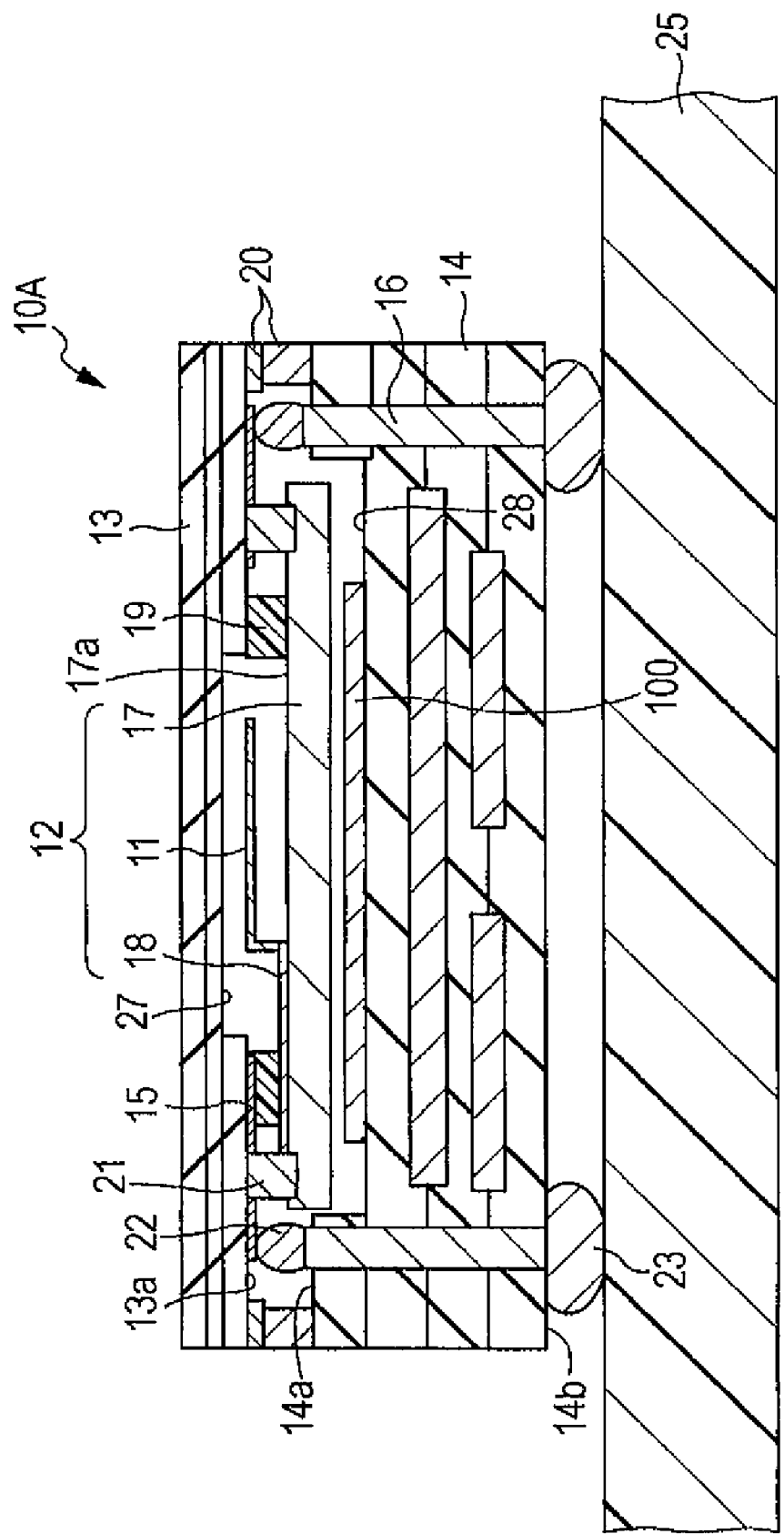
FIG. 3 is a cross-sectional view of an electronic device 10A according to another embodiment of the present invention.

FIG. 3 is a cross-sectional view of an electronic device 10A according to another embodiment of the present invention. This embodiment is similar to the embodiment shown in FIG. 1, and corresponding components are represented by the same reference symbols and description therefor is omitted. Only different features will be described. The electronic device 10A of the present invention further includes a semiconductor logic circuit 100 mounted therein. The semiconductor logic circuit 100 is a circuit element for logical operation composed of a semiconductor. In the case where the MEMS 11 is an accelerometer, an angular speed sensor, or the like and conducts sensing operation, the semiconductor logic circuit 100 is sometimes required to process detected signals. In the present invention, the electronic device 10A may be designed such that the MEMS 11 is controlled by the semiconductor logic circuit 100. In such a case, the semiconductor logic circuit 100 can be mounted on the first substrate 13 or the second substrate 14 and integrated to reduce the size of the electronic device 10A including the semiconductor logic circuit 100.

According to the embodiment shown in FIG. 3, the semiconductor logic circuit 100 is mounted on the second substrate 14. The semiconductor logic circuit 100 is electrically connected to the MEMS 11 by being electrically connected to the second conductor line 16. This enables the semiconductor logic circuit 100 to execute logical operation of the signals detected by the MEMS 11 and control the operation of the MEMS 11. The electronic device 10A having such a structure can also achieve the same advantages as the electronic device 10 of the embodiment shown in FIG. 1 as well as following unique advantages.

The semiconductor logic circuit 100 can be thermally isolated from the MEMS 11 since the semiconductor logic circuit 100 is mounted on the second substrate 14, as shown in FIG. 3. In particular, since the semiconductor logic circuit 100 and the MEMS 11 are separately mounted on different substrates, i.e., the second substrate 14 and the first substrate 13, the heat generated in the semiconductor logic circuit 100 is not readily transmitted to the MEMS 11. The ill effects on the MEMS 11 caused by the heat generated in the semiconductor logic circuit 100 can thereby be effectively decreased.

For example, in the case where the MEMS 11 is an accelerometer of a piezoresistance detection type, the piezoresistance that detects the acceleration is known to be highly susceptible to the ambience temperature surrounding the MEMS 11. However, the detection accuracy of the MEMS 11 can be increased and the reliability of the detection signal (acceleration in the case of the accelerometer) can be enhanced by thermally insulating the MEMS 11 from the semiconductor logic circuit 100 as in this invention. Thus, the operation accuracy of the MEMS 11 can be enhanced.

According to the embodiment shown in FIG. 3, the semiconductor logic circuit 100 is mounted on the first main surface 14a of the second substrate 14 by facing the semiconductor substrate 17. Accordingly, the semiconductor substrate 17 and the semiconductor logic circuit 100 can be arranged nearly symmetrically. That is, the semiconductor substrate 17 composed of a semiconductor is faced to the semiconductor logic circuit 100, and the first substrate 13 and the second substrate 14 are disposed at the outer side of the semiconductor substrate 17 and the semiconductor logic circuit 100. Accordingly, the symmetry in the electronic device 10A in the thickness direction can be increased. As a result, the strains on the MEMS 11 can be more effectively reduced. More preferably, the semiconductor substrate 17 and the semiconductor logic circuit 100 are composed of materials having the same composition. As a result, the symmetry can be further increased and the strains on the MEMS 11 can be more effectively reduced.

According to the embodiment shown in FIG. 3, the second joining means 20 surrounds the semiconductor logic circuit 100 and the electronic component 12. With this structure, the semiconductor logic circuit 100 and the electronic component 12 can be sealed together, thereby rendering additional means for sealing the semiconductor logic circuit 100 unnecessary, and size and weight of the electronic device 10A reduction can be easily achieved.

Figure 4:
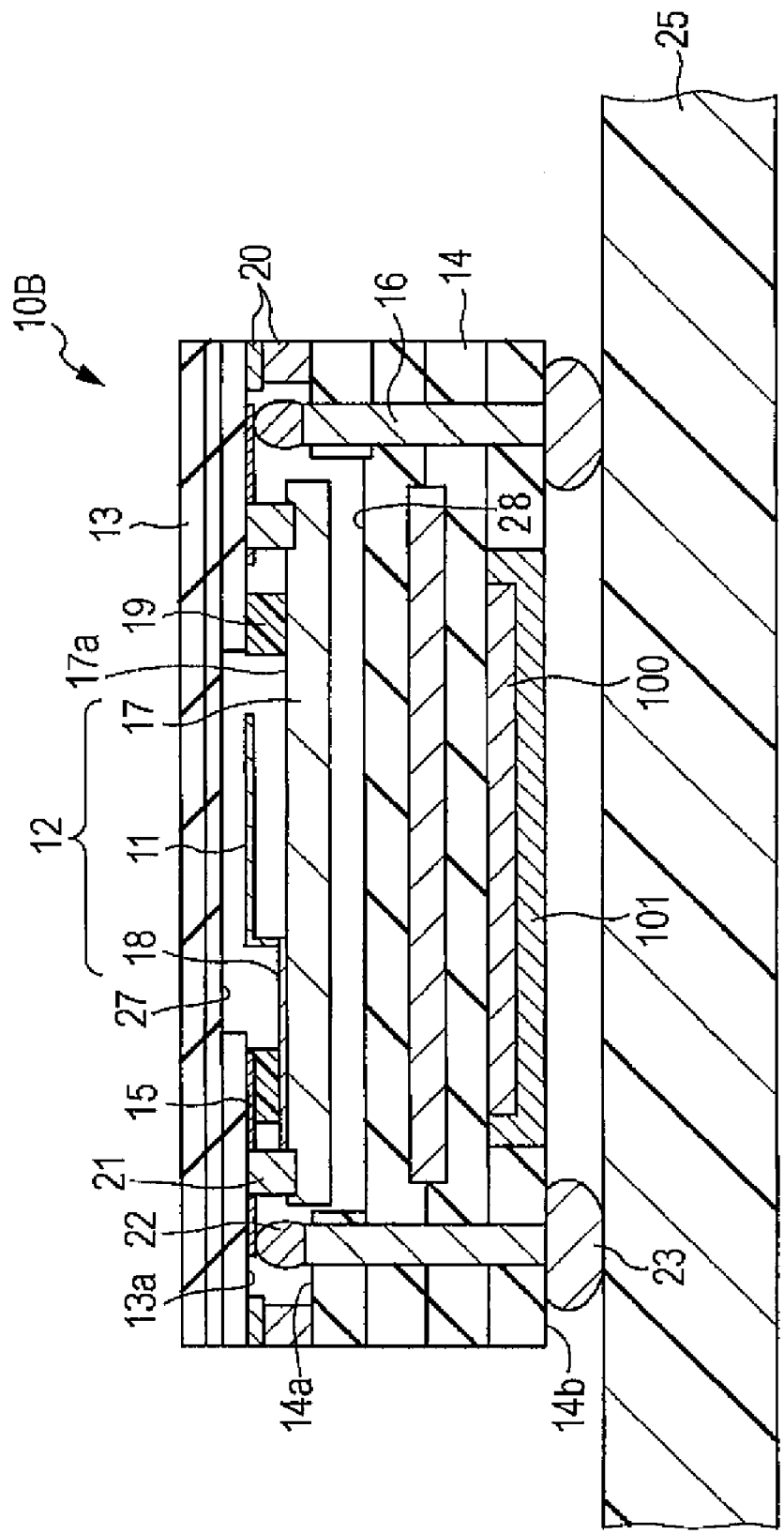
FIG. 4 is a cross-sectional view of an electronic device 10B according to yet another embodiment of the present invention.

FIG. 4 is a cross-sectional view of an electronic device 10B according to yet another embodiment of the present invention. This embodiment is similar to the embodiment shown in FIG. 3, and corresponding components are represented by the same reference symbols and description therefor is omitted. Only different features will be described. In this embodiment, as shown in FIG. 4, a recess 102 is formed in the second main surface 14b of the second substrate, and the semiconductor logic circuit 100 is housed in the recess 102 in the second main surface 14b of the second substrate.

In this case, the semiconductor logic circuit 100 is sealed with sealing means. The sealing means may be, for example, a sealing resin 101, and the sealing may be conducted by molding with the sealing resin 101. Alternatively, the sealing means may be a cover composed of a metal or an insulator, and the recess 102 may be covered with this cover. The sealing means may be any other structure that seals the semiconductor logic circuit 100. The semiconductor logic circuit 100 can be protected and its durability can be enhanced by sealing the semiconductor logic circuit 100.

The electronic device 10B having such a structure can also achieve the same advantages as the electronic device 10 of the embodiment shown in FIG. 1. In addition, as with the electronic device 10A of the embodiment shown in FIG. 3, the electronic device 103 provides a structure that allows the MEMS 11 and the semiconductor logic circuit 100 to cooperate and also achieves the advantages derived from this structure. The effect of thermally insulating the MEMS 11 from the semiconductor logic circuit 100 can be enhanced, the ill effects on the MEMS 11 by the heat generated in the semiconductor logic circuit 100 can be more securely reduced, and the operation accuracy of the MEMS 11, e.g., detection accuracy when the MEMS 11 is a sensor, can be increased.

Figure 5:
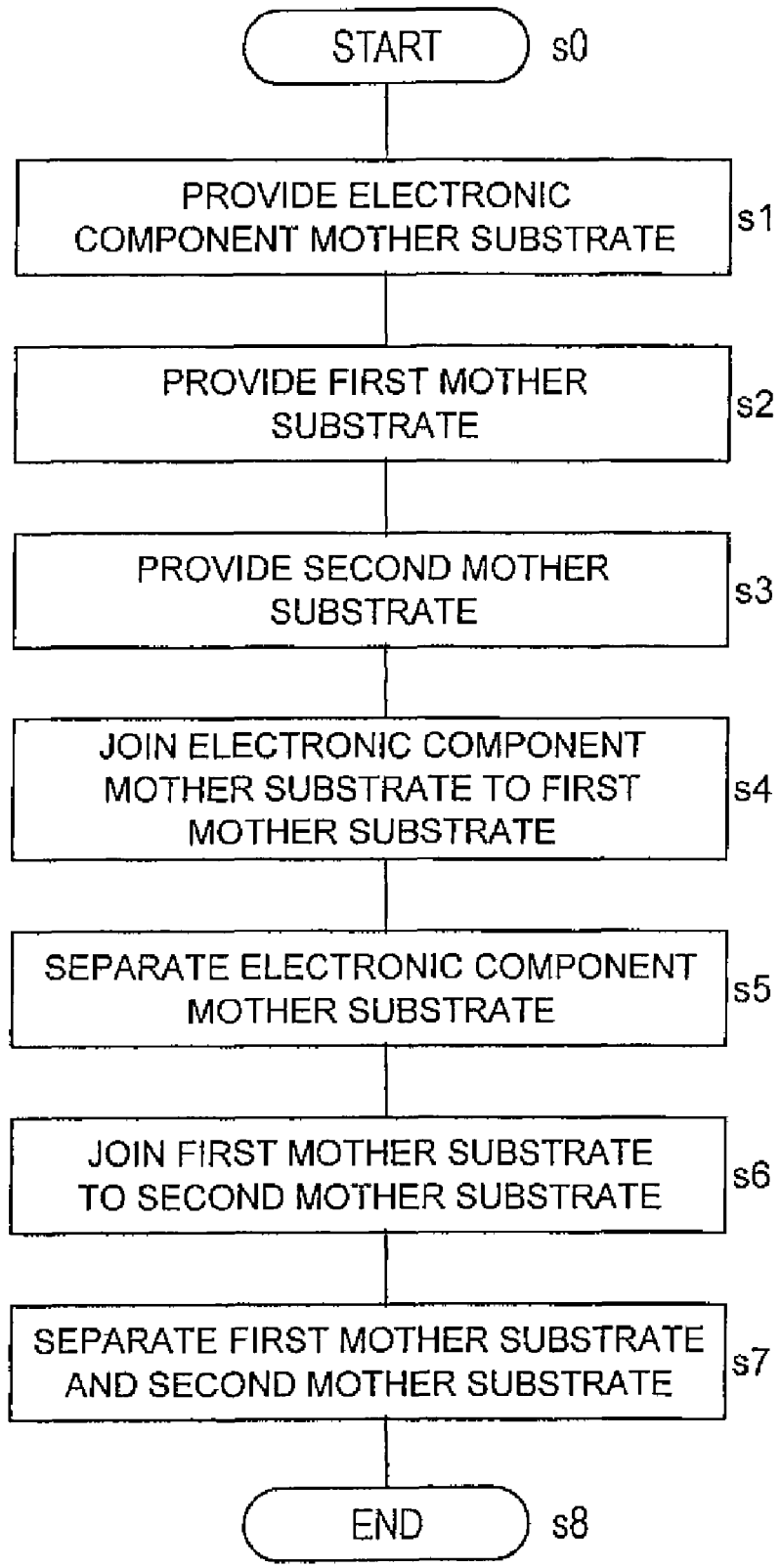
FIG. 5 is a flowchart showing the steps of manufacturing the electronic device 10 according to the manufacturing method of the present invention.

FIG. 5 is a flowchart showing the steps of manufacturing the electronic device 10 according to the manufacturing method of the present invention. FIGS. 6A to 6D are cross-sectional views illustrating the manufacturing steps shown in FIG. 5. FIGS. 5 and 6A to 6D show the steps of manufacturing the electronic device 10 of the embodiment shown in FIG. 1 but these steps can also be used in manufacturing the electronic devices 10A and 103 of the embodiments shown in FIGS. 3 and 4. In FIGS. 6A to 6D, the components common to those shown in FIG. 1 are denoted by the same reference symbols. In order to manufacture the electronic device 10, the process starts in step s0, an electronic component mother substrate 30 is provided in step s1, a first mother substrate 31 is provided in step s2, and a second mother substrate 32 is provided in step s3. The order of performing steps s1 to s3 may be changed or these steps may be performed in parallel. Step s3 should at least be performed before step s6 described below, and may be performed between steps s4 and s5 or between step s5 and s6.

Figure 6A:
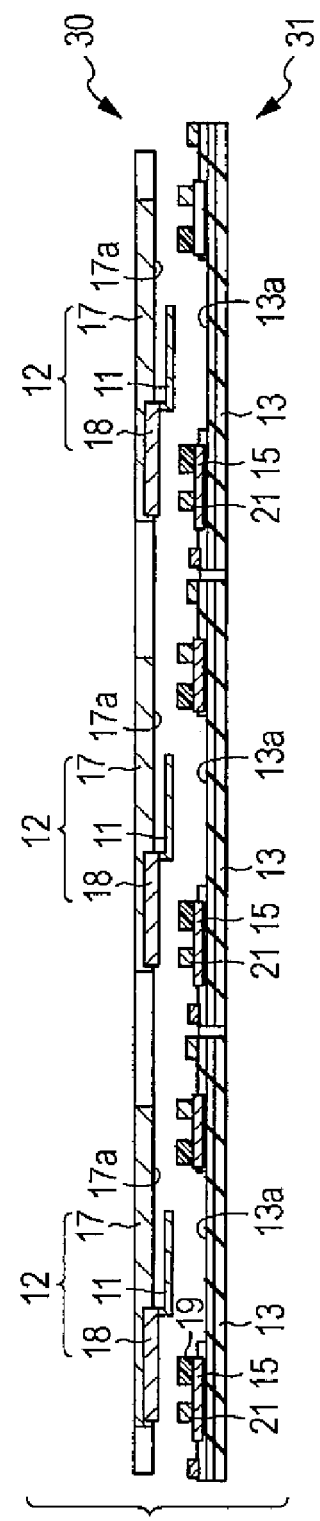

As shown in FIG. 6A, the electronic component mother substrate 30 is a substrate comprising a plurality of electronic component portions 12 are integrally formed and arranged, each electronic component portion 12 including the MEMS 11 and the electrode 18 electrically connected to the MEMS 11 on the first main surface 17a of the semiconductor substrate 17. The electronic component portion 12 is a portion that forms an electronic component 12 when the electronic component mother substrate 30 is separated as described below, and is given the same reference numeral "12". The electronic component portions 12 are, for example, arranged into a matrix.

The electronic component mother substrate 30 has a silicon substrate on which a silicone oxide layer is formed. The silicon substrate has a large number of electronic component portions 12 including MEMS 11 and the electrode 18. MEMS 11 such as micro vibrator and the electrode 18 such as a circular pattern are formed on the silicone oxide layer by applying high accuracy pattern processing technology such as photolithography. The MEMS 11 may be electrically connected to the electrode 18 through a high accuracy pattern formed on the first main surface 17a of the semiconductor substrate 17.

As shown in FIG. 6A, the first mother substrate 31 is a substrate comprising a plurality of first substrate portions 13 are integrally formed and arranged. The first substrate portion 13 is a portion that forms a first substrate 13 when the first mother substrate 31 is separated as described below, and is given the same reference numeral "13". The first substrate portions 13 are formed at positions corresponding to the electronic component portions 12 so that when the electronic component mother substrate 30 and the first mother substrate 31 face each other, one first substrate portion 13 and one electronic component portion 12 face each other. For example, the first substrate portions 13 are arranged into a matrix. The first conductor line 15, the first joining member 19, and the first connecting terminal 21 are formed on the first main surface 13a of each first substrate portion 13.

Figure 6D:
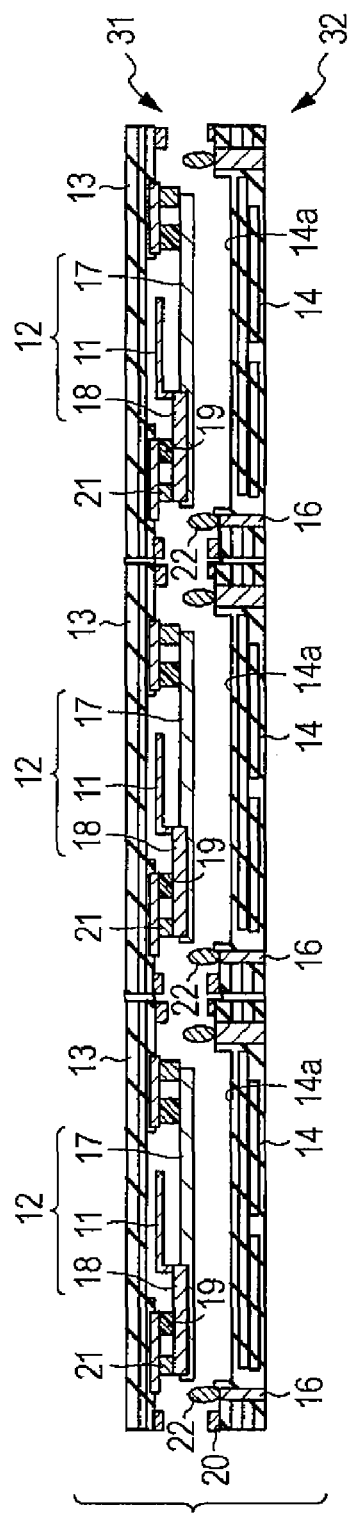

As shown in FIG. 6D, the second mother substrate 32 is a substrate comprising a plurality of second substrate portions 14 are integrally formed and arranged. The second substrate portion 14 is a portion that forms a second substrate 14 when the second mother substrate 32 is separated as described below, and is given the same reference numeral "14". The second substrate portions 14 are formed at positions corresponding to the first substrate portions 13 so that when the first mother substrate 31 and the second mother substrate 32 face each other, one first substrate portion 13 and one second substrate portion 14 face each other. For example, the first substrate portions 14 are arranged into a matrix. The second conductor lines 16 are formed by penetrating the second substrate portions 14, and the second joining member 20 and the connecting terminal 22 are formed on the first main surface 14a of each second substrate portion 14.

In the case of manufacturing the electronic devices 10A and 10B of the embodiments shown in FIGS. 3 and 4, the semiconductor logic circuit 100 is mounted on each second substrate portion 14 of the second mother substrate 32. In the case of the electronic device 10A of the embodiment shown in FIG. 3, the semiconductor logic circuit 100 is mounted on the first main surface 14a of each second substrate portion 14 and electrically connected to the second conductor line 16. In the case of the electronic device 10B of the embodiment shown in FIG. 4, the recess 102 is formed in the second main surface 14b of each second substrate portion 14, and the semiconductor logic circuit 100 is housed in the recess 102 and electrically connected to the second conductor line 16. The semiconductor logic circuit 100 in this state is then sealed with sealing means such as the sealing resin 101 or the cover.

For example, when the first substrate 13 is composed of a sintered glass ceramic such as aluminum oxide-borosilicate glass and the first conductor line 15 is composed of silver, the first mother substrate 31 can be formed as follows. First, raw material powder of aluminum oxide, silicon oxide, calcium oxide, and the like is mixed with an organic resin, a binder, and the like to obtain a slurry, and the slurry is formed into sheets by a doctor blade method or a lip coater method to form a plurality of green sheets. A metalizing paste of tungsten is applied on surfaces of the green sheets by printing and the green sheets are stacked and sintered to form the first mother substrate 31.

For example, when the second substrate 14 is composed of a sintered glass ceramic such as aluminum oxide-borosilicate glass and the second conductor line 16 is composed of silver, the second mother substrate 32 can be formed as follows. Through holes are formed in the green sheets similar to those described above and filled with the same metallizing paste. Then the green sheets are stacked and sintered to form the second mother substrate 32.

Some of the green sheets may be subjected to a punching process to form rectangular openings or the like and may be arranged to come at the first main surface side to form the recesses 27 and 28 in the first and second substrates 13 and 14.

In the case where the first joining member 19 is composed of a glass frit material, the first joining member 19 can be formed on the first mother substrate 31 by adding appropriate filler powder (zirconium tungstate phosphate: $Zr_2WO_4(PO_4)_2$) to glass powder ($Zn$—$SiO_2$—$Bi_2O_3$-based glass), mixing the resulting mixture with an appropriate binder to prepare a glass frit paste, applying the glass frit paste by printing, and sintering the applied glass frit paste.

A second joining member 20 composed of, for example, a gold-tin (Au—Sn) alloy can be formed on the second mother substrate 32 by applying a gold-tin (Au—Sn) alloy paste by printing and heating the applied paste under pressure in a reflow furnace at a temperature of about 300° C.

Bumps, such as gold (Au) bumps, having substantially the same height as the first joining member 19 are formed on the first and second mother substrates 31 and 32. The gold (Au) bumps can be formed by a common stud bump forming method using gold (Au) wires and a wire bonding machine.

In order to make the second connecting terminals 22 composed of, for example, a gold-tin (Au—Sn) solder, balls of this solder are placed at predetermined positions, melted by heating, and cooled for joining. Alternatively, the second connecting terminal 22 can be made together as forming the second joining member 20 by printing.

In step s4, as shown in FIG. 6A, the first main surface of the electronic component mother substrate 30 and the first main surface of the first mother substrate 31 face each other. The first main surface of the electronic component mother substrate 30 is the main surface that includes the first main surfaces 17a of the semiconductor substrates 17. The first main surface of the first mother substrate 31 is the main surface that includes the first main surfaces 13a of the first substrates 13. The electronic component mother substrate 30 and the first mother substrate 31 are arranged so that one electronic component portion 12 and one first substrate portion 13 face each other.

In step s4, as shown in FIG. 6B, the electronic component portions 12 are joined to the first substrate portions 13. In this step, an apparatus that can apply heat and pressure, such as a wafer bonding machine, can be used to stably join the electronic component mother substrate 30 to the first mother substrate 31 in a stable manner. The joining temperature is 350° C. to 450° C., and the pressure is selected on the basis of the type of glass in the first joining member 19 and the joining temperature. As a result, the electrode 18 of each electronic component portion 12 is electrically connected to the first conductor line 15 of the corresponding first substrate portion 13 through the first connecting terminal 21, and the first main surface 17a of the semiconductor substrate 17 of each electronic component portion 12 is mechanically connected to the first main surface 13a of the corresponding first substrate portion 13 through the first joining member 19 to hermetically seal the MEMS 11.

Next, in step s5, as shown in FIG. 6C, the electronic component mother substrate 30 is separated with a cutting blade 33 such as a dicing blade into individual electronic component portions 12. The electronic component mother substrate 30 is separated while removing the portions connecting the electronic component portions 12 to one another. In step s5, the first mother substrate 31 is not separated, and only the electronic component mother substrate 30 is separated.

In step s6, as shown in FIG. 6D, the first main surface of the second mother substrate 32 and the first main surface of the first mother substrate 31, in which one electronic component 12 is mounted on one first substrate 13 as a result of separating the electronic component mother substrate 30 in step s5, face each other. The first main surface of the second mother substrate 32 is the main surface that includes the first main surfaces 14a of the second substrates 14. The first mother substrate 31 including the electronic components 12 and the second mother substrate 32 are arranged so that one electronic component 12 and one first substrate portion 13 face one second substrate portion 14.

In step s6, heat treatment is conducted, for example, under pressure in a reflow furnace at a temperature of about 280° C. or more and 300° C. or less to electrically connect the first conductor lines 15 of the first substrate portions 13 to the second conductor lines 16 of the corresponding second substrate portions 14 with the second connecting terminals 22, and to mechanically connect the first main surfaces 13a of the first substrate portions 13 to the first main surfaces 14a of the corresponding second substrate portions 14 by joining through the second joining members 20.

In next step s7, the first mother substrate 31 is separated into the first substrates 13 and the second mother substrate 32 is separated into the second substrates 14. The first and second substrates 31 and 32 are separated with a cutting blade while removing the portions connecting the first substrate portions 13 to one another and portions connecting the second substrate portions 14 to one another. The cutting blade for separating the first and second substrates 31 and 32 may be the same cutting blade as the cutting blade 33 that separates the electronic component mother substrate 30 or a different blade. After the first and second mother substrates 31 and 32 are separated to obtain individual electronic devices 10 as described above, the manufacture of the electronic device 10 ends at step s8.

A plurality of electronic devices 10 can be easily and assuredly manufactured through the steps described above, and the productivity can be enhanced. Since the MEMS 11 remains sealed during the steps of separating the electronic component mother substrate 30, the first mother substrate 31, and the second mother substrate 32, cutting dust from the semiconductor substrate such as silicon that arises during separating does not deposit on the MEMS 11, and the resulting microelectromechanical system of the microelectromechanical device is less likely to cause malfunction. Thus, electronic devices 10 that operate satisfactorily can be obtained.

Figure 8:
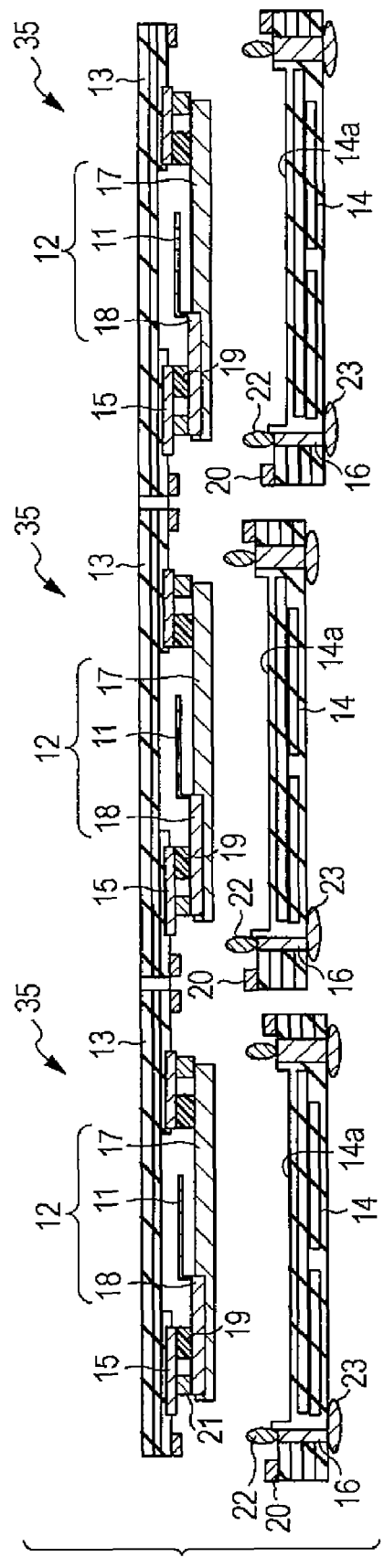
FIG. 8 is a cross-sectional view illustrating the manufacturing steps shown in FIG. 7.
Figure 9:
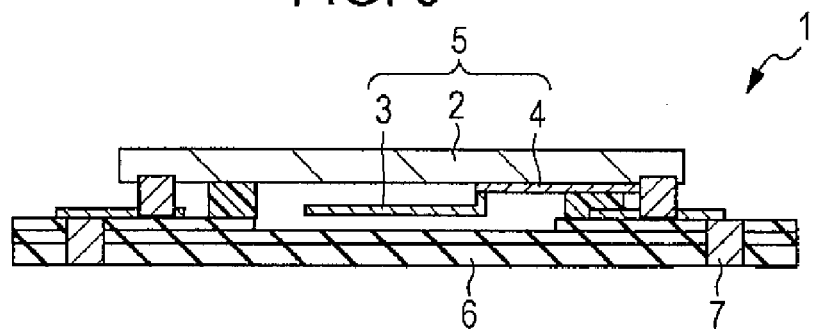
FIG. 9 is a cross-sectional view of an electronic device 1 of related art.
Figure 10:
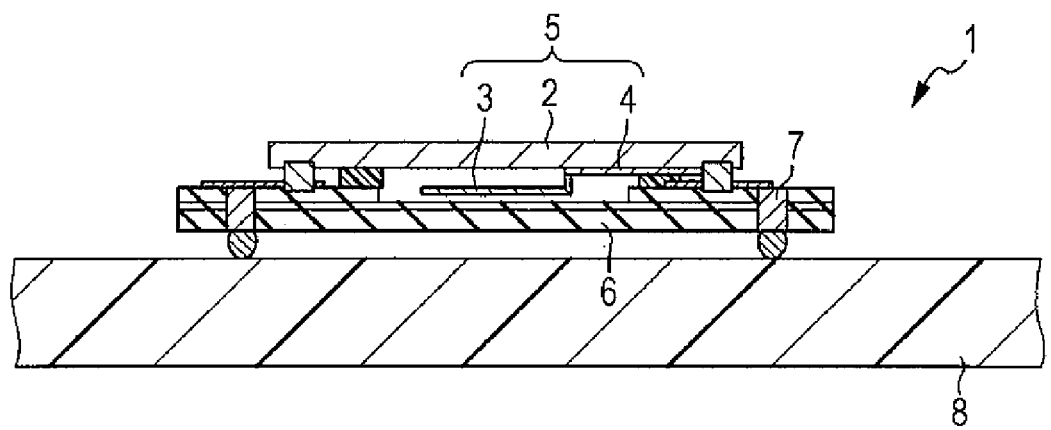
FIG. 10 is a cross-sectional view showing the state in which the electronic device 1 is mounted on a printed board 8.
Figure 11:
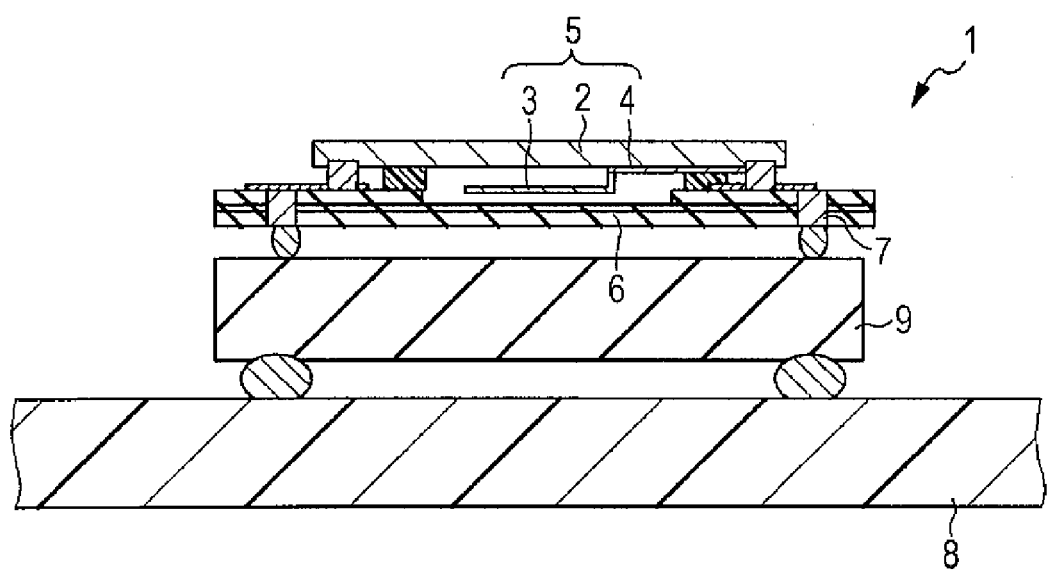
FIG. 11 is a cross-sectional view showing another state in which the electronic device 1 is mounted on the printed board 8.
Figure 12:
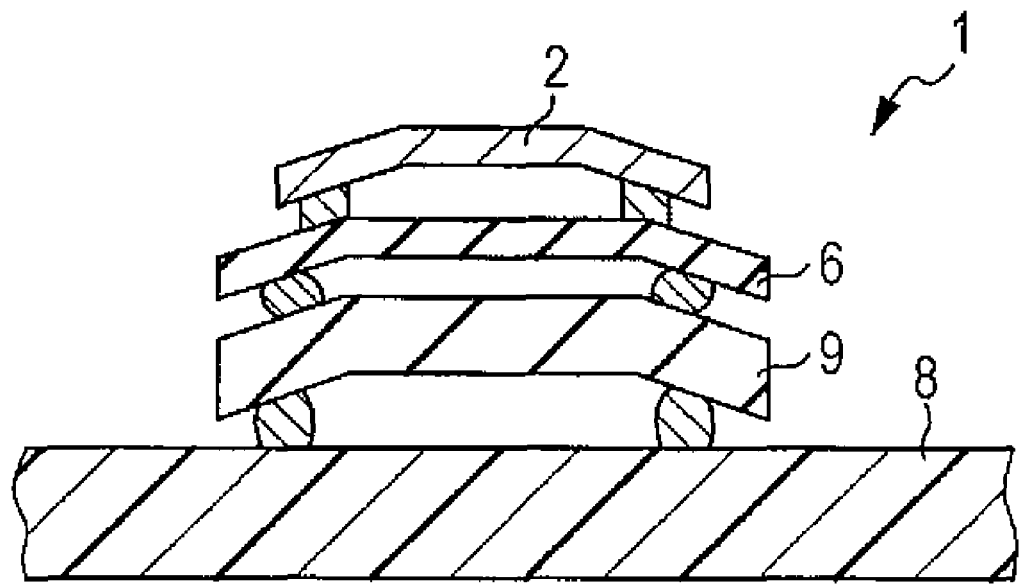
FIG. 12 is a cross-sectional view showing one example of warpage that occurs in the electronic device 1.
Figure 13:
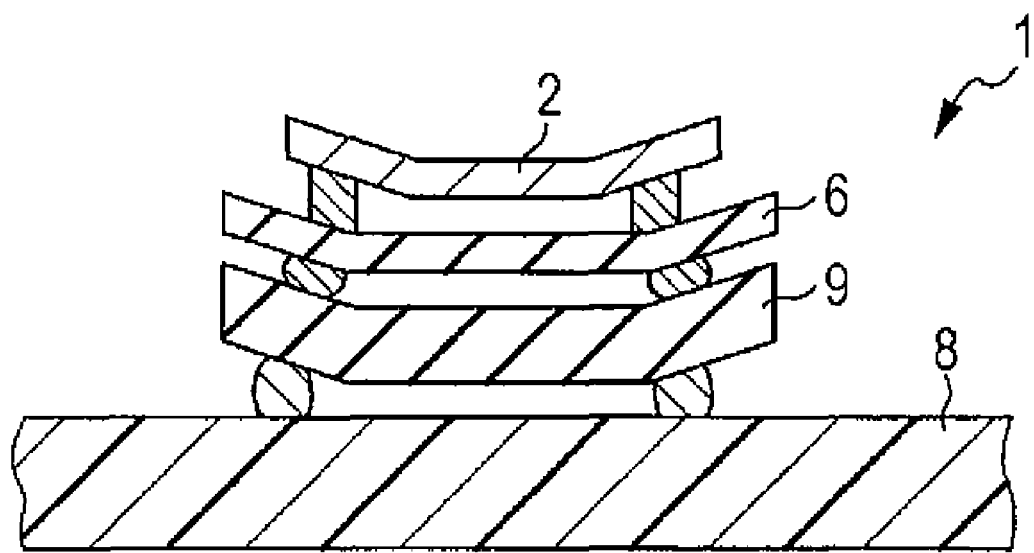
FIG. 13 is a cross-sectional view showing another example of warpage that occurs in the electronic device 1.

FIG. 7 is another flowchart showing the steps of manufacturing the electronic device 10 according to the manufacturing method of the present invention. FIG. 8 is a cross-sectional view illustrating the manufacturing steps shown in FIG. 7. FIGS. 7 and 8 show the steps of manufacturing the electronic device 10 of the embodiment shown in FIG. 1 but these steps can also be used in manufacturing the electronic devices 10A and 10B of the embodiments shown in FIGS. 3 and 4. In FIG. 8, the components common to those shown in FIG. 1 are denoted by the same reference symbols. The manufacturing step shown in FIG. 7 is similar to the manufacturing steps shown in FIG. 5. Only the differences will be described. Steps a0 to a2 in the production steps of FIG. 7 are identical to steps s0 to s2 in the production steps of FIG. 5. In step a3, a plurality of second substrates 14 is provided. The order of performing steps a1 to a3 may be changed or these steps may be performed in parallel. Step a3 should at least be performed before step a6 described below, and may be performed between steps a4 and a5 or between step a5 and a6.

The electronic component mother substrate 30 and the first mother substrate 31 are provided as described above. The second substrates 14 can be provided by, for example, forming the second mother substrate 32 described above and separating the second mother substrate 32 into the second substrate portions 14. In the case of manufacturing the electronic devices 10A and 10B of the embodiments shown in FIGS. 3 and 4, the semiconductor logic circuit 100 should be mounted on the second substrate portion 14 of the second mother substrate 32.

Steps a4 and a5 in FIG. 7 are identical to steps s4 and in FIG. 5.

Next, in step a6, each first main surface 13a of the first substrate portion 13 of the first mother substrate 31 and the first main surface 14a of the corresponding second substrate 14 face each other. Then, heat treatment is conducted, for example, in a reflow furnace at a temperature of about 320° C. or more and 350° C. or less to electrically connect the first conductor lines 15 of the first substrate portions 13 to the second conductor lines 16 of the corresponding second substrate 14, and to mechanically connect the first main surfaces 13a of the first substrate portions 13 to the first main surfaces 14a of the corresponding second substrates 14 by joining through the second joining member 20.

In step a6, a fixture for holding a plurality of second substrates 14 is preferably used to together join the first mother substrate 31 to the plurality of second substrates 14. In next step a7, the first mother substrate 31 is separated into the first substrate portions 13. The first mother substrate 31 is separated with a cutting blade while removing the portions connecting the first substrate portions 13 to one another. The cutting blade for separating the first mother substrate 31 may be the same cutting blade as the cutting blade 33 that separates the electronic component mother substrate 30 or a different blade. After the first substrate 31 is separated and a plurality of electronic devices 10 are obtained, the manufacture of the electronic device 10 ends at step a8.

According to this manufacturing method, a plurality of electronic devices 10 can be easily and assuredly manufactured, and the productivity can be enhanced. Since the MEMS 11 remains sealed during the steps of separating the electronic component mother substrate 30, the first mother substrate 31, and the second mother substrate 32, cutting dust from the semiconductor substrate such as silicon that arises during separating does not deposit on the MEMS 11, and the resulting microelectromechanical system of the microelectromechanical device is less likely to cause malfunction. Thus, electronic devices 10 that operate satisfactorily can be obtained.

The present invention is not limited to the embodiments described above and various modifications are possible within the scope of the present invention. For example, although only one MEMS 11 is sealed in one electronic device 10 according to the above-described embodiments, a plurality of MEMSs 11 may be sealed in one electronic device 10.

At least one of the first joining member 19 and the second joining member 20 may be made conductive and electrically connected to a ground conductor. With this structure, the first joining member 19 and the second joining member 20 can function as electromagnetic shields, and occurrence of noise in the MEMS 11 can be effectively reduced.

Moreover, it is not essential for both of the first and second sealing members 19 and 20 to have an end-free annular structure to seal the interior. For example, in the case where the first joining member 19 has an end-free annular structure capable of sealing the interior, the second joining member 20 can be configured to join the first substrate 13 to the second substrate 14 at several spots. Alternatively, the second joining member 20 may be designed to function as the second connecting terminals 22.

The position where the first conductor line 15 is formed is not limited to the surface of the first substrate 13. The first conductor line 15 may be formed inside the first substrate 13.

The present invention can be implemented in other various forms without departing from the spirit or main features of the invention. Thus, the embodiments described above are merely examples in every aspect. The scope of the present invention is defined solely by the attached claims and the specification should not be construed as the limitations. All modifications and alterations within the scope of the claims are within the scope of the present invention.

The invention claimed is:

1. A microelectromechanical device including a microelectromechanical system, comprising:
   an electronic component including a semiconductor substrate, the microelectromechanical system disposed on a first main surface of the semiconductor substrate and an electrode electrically connected to the microelectromechanical system;
   a first substrate having a first main surface on which the electronic component is mounted with first connecting means so that the first main surface of the first substrate faces the first main surface of the semiconductor substrate;
   a second substrate having a first main surface on which the first substrate is mounted through second connecting means so that the first main surface of the second substrate faces the first main surface of the first substrate;
   a first conductor line disposed on the first main substrate and electrically connected to an electrode of the semiconductor substrate at the first main surface of the first substrate; and
   a second conductor line disposed on the second substrate and electrically connected to the first conductor line at the first main surface of the first substrate; the second conductor line being connected to the first conductor line at the inner side of the second connecting means.

2. The microelectromechanical device according to claim 1, wherein a recess in which the microelectromechanical system is housed is formed in the first main surface of the first substrate.

3. The microelectromechanical device according to claim 1, wherein the first connecting means surrounds the microelectromechanical system and seals the microelectromechanical system.

4. The microelectromechanical device according to claim 1, wherein the second connecting means surrounds the electronic component and seals the electronic component.

5. The microelectromechanical device according to claim 1, wherein the first connecting means contains a resin.

6. The microelectromechanical device according to claim 5, wherein the resin is a benzocyclobutene resin.

7. The microelectromechanical device according to claim 5, wherein the resin is a liquid crystal polymer.

8. The microelectromechanical device according to claim 1, wherein the second connecting means contains a metal.

9. The microelectromechanical device according to claim 8, wherein the metal contains at least one of a Au—Sn alloy, a Sn—Cu alloy, a Sn—Ag—Cu alloy, and a Pb—Sn alloy.

10. A microelectromechanical device including a microelectromechanical system, comprising:
    an electronic component including a semiconductor substrate, the microelectromechanical system disposed on a first main surface of the semiconductor substrate;
    a first substrate having a first main surface on which the electronic component is mounted with first connecting means so that the first main surface of the first substrate faces the first main surface of the semiconductor substrate; and
    a second substrate having a first main surface on which the first substrate is mounted through second connecting means so that the first main surface of the second substrate faces the first main surface of the first substrate;
    wherein a thermal expansion coefficient of the first substrate is smaller than a thermal expansion coefficient of the second substrate, and a thermal expansion coefficient of the semiconductor substrate is smaller than the thermal expansion coefficient of the first substrate.

11. The microelectromechanical device according to claim 1, wherein the first substrate contains a material having a transparency, and the microelectromechanical system is an optical microelectromechanical system.

12. The microelectromechanical device according to claim 1, wherein a semiconductor logic circuit is mounted.

13. The microelectromechanical device according to claim 12, wherein the semiconductor logic circuit is mounted on the second substrate.

14. The microelectromechanical device according to claim 13, wherein the semiconductor logic circuit is mounted on the first main surface of the second substrate and faces the semiconductor substrate.

15. The microelectromechanical device according to claim 1, comprising a connecting terminal that electrically connects the first conductor line to the second conductor line, wherein the connecting terminal is disposed at the inner side or outer side of the second connecting means.

* * * * *